United States Patent [19]
Hayashi

[11] Patent Number: 5,442,142
[45] Date of Patent: Aug. 15, 1995

[54] LARGE-CURRENT CIRCUIT BOARD AND METHOD THEREFOR

[75] Inventor: Satoru Hayashi, Aichi, Japan

[73] Assignee: Mitsubishi Denki Kabushiki Kaisha, Tokyo, Japan

[21] Appl. No.: 129,605

[22] Filed: Sep. 30, 1993

[30] Foreign Application Priority Data

Sep. 30, 1992 [JP] Japan .................. 4-261501
Mar. 19, 1993 [JP] Japan .................. 5-060209

[51] Int. Cl.⁶ ............................................ H05K 1/00
[52] U.S. Cl. ...................... 174/250; 174/261; 174/262; 174/267; 361/770; 361/804; 439/78
[58] Field of Search .............. 174/250, 255, 261, 262, 174/266, 267; 361/760, 770, 784, 785, 791, 804; 439/76, 78

[56] References Cited

U.S. PATENT DOCUMENTS 4,899,439  2/1990  Potter et al. .
5,065,283  11/1991  Adachi et al. .................. 361/407

FOREIGN PATENT DOCUMENTS 60-257191  12/1985  Japan .
245665  3/1990  Japan .

Primary Examiner—Leo P. Picard
Assistant Examiner—Cheryl R. Figlin
Attorney, Agent, or Firm—Sughrue, Mion, Zinn, Macpeak & Seas

[57] ABSTRACT

A large-current circuit board having a plurality of fasteners positioned and secured beforehand to the circuit board, and a plurality of busbars for electrically connecting the plurality of fasteners. Each of the plurality of busbars has a strip-like planar plate shape. Various ones of the plurality of fasteners may have the same or different distances from the surface of the circuit board. Specifically, the portions of the fasteners that are connected with the busbars may be at different heights so that plural busbars connecting the fasteners can cross each other at plural levels. A variety of fasteners and busbar securing boards may be used for electrically connectibly holding and securing the plurality of busbars with the plurality of fasteners on the circuit board. Some of the plurality of busbars can be disposed on either or both side of the busbar securing boards and will have through holes passing through said busbars and said busbar securing board are formed at the locations of both ends of each of the busbars so that the fasteners and the busbars are secured together with the busbar securing board, and the busbar securing board is assembled to the circuit board integrally with the plurality of busbars.

25 Claims, 22 Drawing Sheets 1605  1606  1604  1603  1602  1601

LARGE-CURRENT CIRCUIT BOARD AND METHOD THEREFOR

BACKGROUND OF THE INVENTION
1. Field of the Invention

The present invention relates to a large-current circuit board including a plurality of fasteners for applying relatively large current to a circuit board and a plurality of busbars for connecting the plurality of fasteners. It also concerns methods of assembly therefor.

2. Description of the Background Art

FIG. 34 is a perspective view showing a printed wiring board (printed circuit board) known in the art serving as a large-current circuit board disclosed in Japanese Laid-Open Patent Publication SH062-257191. In this drawing, the numeral 801 indicates a printed wiring board, 802 denotes an insulating board, 803A, 803B, 804A and 804B represent circuit patterns, 805A and 805B designate conductor plates, 806 and 807 indicate terminal holes, and 808 denotes holes used for soldering.

In the example of FIG. 34, the electrically conductive circuit patterns 803A, 803B, 804A, 804B are formed on the insulating board 802, the electrically conductive plates 805A, 805B having a similar shape to the patterns 804A, 804B are applied and joined to at least part of the circuit patterns 803, and the circuit board is applicable to a circuit carrying current of several ten amperes or more.

While this conventional art is effective for the application of large current in the plane direction of the board, it is difficult to apply large current in the vertical direction of the board, i.e., through hole direction. Further, since the electrically conductive plates are disposed on the board plane, the patterns must be laid out to prevent the electrically condctive plates from overlapping with each other.

FIG. 35 shows a wiring pattern example of electrical conductors also known in the conventional art. In this drawing, 901 denotes a printed circuit board, 902 designates holes, 903 and 904 indicate hook-shaped electrically conductive plates, and 905 represents a straight-line electrically conductive plate. The formation of a large-current circuit using not only the straight-line electrically conductive plate 905 but also the hook-shaped electrically conductive plates 903, 904 is generally disclosed in Japanese Laid-Open Patent Publication SH060-257191 and in Japanese Laid-Open Utility Model Publication HEI2-45665 which will be described later. Recently, there is a greater demand for more compact products without loss of freedom for parts layout. However, it is often the case that terminals cannot be arranged for electrical connection by only using straight-line conductors, and odd-shaped electrical conductors are often employed.

When electrically conductive plates are actually manufactured, straight-line electrically conductive plates may be manufactured easily by, for example, cutting a copper line. However, hook-shaped electrically conductive plates are manufactured by, for example, bending a copper line or die-cutting a copper plate with dies. Accordingly, when electrically conductive plates have complex shapes like a hook, dies must be manufactured and machined for each shape in the manufacturing of the conductors, resulting in increased equipment and jig costs and machining costs or in increased material costs for shapes that will waste materials.

FIG. 36 shows another conventional design disclosed in Japanese Laid-Open Utility Model Publication HEI-245665. In FIG. 36, 1001 indicates an insulating board, 1002A to 1002D designates electronic circuits, 1003A to 1003C represents large-current circuits, 1004 denotes drawn holes, and 1005 indicates self-clinching holes. The large-current circuits 1003A to 1003C comprising oxygen-free copper plates are formed on the same plane with the board surface of the insulating board 1001.

FIG. 37 is a sectional view of a conventional art board fastener used with a large-current circuit board disclosed in Japanese Laid-Open Patent Publication HEI2-159787. In FIG. 37, 1100 is a sectional view of a board fastener wherein 1101 indicates a cylindrical portion having an outside diameter 1103 and an inside diameter 1107 and a lip or flange portion with an outside diameter 1102.

A procedure of locking the board faster 1101 shown in FIG. 37 to a circuit board, e.g., a printed circuit board, by caulking will now be described in accordance with FIGS. 38 and 39. As shown in FIG. 38, the board fastener is inserted into a through hole 1201a provided in a printed circuit board 1201 and is pushed therein until flange 1104 makes contact with the printed circuit board 1201.

When the board fastener 1100 in the state shown in FIG. 38 is then pressed by a tool (not shown) so that it is compressed in an axial direction, a portion 1101b of the cylindrical portion 1101 protruding from the through hole 1201a of the printed circuit board 1201 is transformed, as shown in FIG. 39, to be larger in the outside diameter 1102. As shown in FIG. 39, the printed circuit board 1201 is held between the transformed portion 1301 and the flange 1104, whereby the printed circuit board 1201 and a caulked/locked body 1300 are locked with each other. The board fastener 1100 caulked to the printed circuit board 1201 is referred to as the caulked/locked body 1300.

FIG. 40 illustrates an application example of the caulked/locked body 1300. According to this application example, the board fastener 1100 is inserted into a through hole 1201s provided in the printed circuit board 1201 and caulked to be locked to the printed circuit board 1201.

Also, a screw 1401 is inserted into a through hole 1402a of a busbar 1402 and subsequently inserted into the caulked/locked body 1300 from the side of the cylindrical portion 1106, thereby protruding a threaded portion 1401a of the screw 1401 from the side of the flange 1104.

The threaded portion 1401a is screwed into a thread hole provided in a terminal 1403a of a circuit part 1403 and the screw 1401 is tightened to lock the busbar 1402 and the terminal 1403a to the caulked/locked body 1300, whereby the through hole 1201s of the printed circuit board 1201 and the caulked/locked body 1300 are connected electrically and also the busbar 1402, the terminal 1403a of the circuit part 1403, and the caulked/locked body 1300 are connected electrically, forming a large-current circuit board.

In the conventional art disclosed in Japanese Laid-Open Patent Publication HEI2-159787 and the conventional art printed board art disclosed in Japanese Laid-Open Utility Model Publication HEI2-45665, the oxygen-free copper plates or the like allow large current to flow in the plane direction of the board and the fasteners and the drawn portions of the conductors allow large current to flow also in the through hole direction. Since the electrically conductive plates are disposed on the plane in both cases, however, a pattern layout must be set to prevent the electrically conductive plates from overlapping with each other, placing large restrictions on design.

Namely, when the electrically conductive plates are complex-shaped in such cases, dies must also be manufactured and machined for each shape of conductor, resulting in increased equipment and jig costs and machining costs or in increased material costs for shapes that will leave many remainders of materials. Especially for size reduction, large-current carrying wirings must made to be higher in density but the conductor shapes become further complicated.

FIG. 41 shows another conventional design disclosed in Japanese Laid-Open Patent Publication SHO57-190335. In FIG. 41, two wirings 1502, 1503 cross each other on the surface of a mother board 1501. A small board 1504 is disposed above one wiring 1502. An air gap 1505 is provided between the small board 1504 and the wiring 1502. 1506 indicates joints and 1507 denotes solder.

On the mother board 1501, the two wirings have a crossing portion in an insulated state, the small board 1504 is placed above one wiring 1502, and the air gap 1505 is provided between the small board 1504 and the wiring 1502. In addition, the other wiring 1503 is formed on the small board 1504 to provide the crossing portion of both wirings and the metal (solder) 1507 is applied to the conductor joints of the wiring 1503, thereby reducing the electrical resistance of both wirings with the wirings kept isolated.

In this conventional design, the conductors are crossed and the wirings are made to be higher in density, thereby increasing the freedom of design. That is, since the circuit having the crossed wirings is designed to connect the electrically conductive plates in a bridge shape, the shapes of the electrical conductors can be relatively simplified. Unfortunately, the bridge-shaped electrically conductive plates require the number of machining processes and the number of parts to increase and have disadvantages in costs and work required.

As an application example of such conventional crossed wiring art, wherein a bridge-shaped busbar as shown in FIGS. 42a and 42b is placed on a circuit board, have actually been put to practical use. In FIGS. 42a and 42b, 1601 indicates a printed circuit board and 1602 denotes a bridge-shaped busbar. 1603, 1604 and 1605 indicate straight-line busbars.

The bridge-shaped busbar 1602 allows a large-current circuit to be multi-layered in part. However, a plate-shaped material must be machined to have a bridge shape. In order to manufacture the bridge-shaped busbar 1602, predetermined dimensions are required for retaining parts during the machining or for boring or bending, e.g., predetermined radii are required for bending. In addition, wiring and assembling the bridge-shaped busbar requires high accuracy for position setting due to its complex shape.

Having the aforementioned dimensional restrictions, the bridge-shaped busbar is sized to greater than the dimensions required for wiring. In other words, as shown in FIGS. 42a and 42b, the minimum value of a distance 1606 between the busbars 1604 and 1605 is determined by a dimension required to manufacture the bridge-shaped busbar and by an insulation distance. To make the bridge-shaped busbar 1602 smaller, the dimensions required to manufacture the bridge-shaped busbar must be reduced.

Any of the conventional art large-current circuit boards arranged as described above allows large current to flow in the plane direction of the board and its fasteners and drawn portions of the conductors allow large current to flow also in the through hole direction. However, since the electrically conductive plates are disposed on the board plane, the pattern layout must be set to prevent the electrically conductive plates from overlapping with each other, placing large restrictions on design.

Especially for size reduction, the large-current carrying wirings must be made to be higher in density, but the conductor shapes must be complicated, such as a hook, and dies must be manufactured and machined for each shape in the manufacturing of the conductors, resulting in increased equipment and jig costs and machining costs or in increased material costs for shapes that will leave many material remainders.

Also known in the art is another large-current circuit board which has crossed conductors, high-density wirings and increased freedom of design. Since the circuit board including the crossed wirings is designed to connect the electrically conductive plates in a bridge shape, the shapes of the electrical conductors can be relatively simplified, but the bridge-shaped electrically conductive plates require a number of machining processes and a number of parts to increase and have disadvantages in costs and work.

Also, since the fasteners are caulked and secured to the board, the reliability of the circuit board was not sufficiently high.

It is accordingly an object of the present invention to overcome the disadvantages in the conventional art by providing a large-current circuit board which allows comparatively large current to flow in both a plane direction and a through hole direction of a circuit board, allows wirings to be high in density, ensures ease of manufacturing busbars and fitting the same to the circuit board, and facilitates assembling and automation.

Another object of the present invention is to provide a large-current circuit board which is high in reliability.

SUMMARY OF THE INVENTION

A large-current circuit board embodying the present invention comprises a plurality of fasteners positioned and secured beforehand to the circuit board, and a plurality of busbars for electrically connecting the plurality of fasteners. Each of the plurality of busbars has a strip-like planar plate shape. Various ones of the plurality of fasteners may have the same or different heights above the surface of the circuit board. Specifically, the portions of the fasteners that are connected with the busbars may be at different heights so that plural busbars connecting the fasteners can cross each other at plural levels.

A large-current circuit board concerned with another feature of the invention has a plurality of fasteners positioned and secured beforehand on the circuit board, a plurality of busbars having strip-like planar plate shapes for electrically connecting the plurality of fasteners, and a busbar securing board for electrically connectibly holding and securing the plurality of busbars with the plurality of fasteners on the circuit board, and at least some of the plurality of busbars are disposed on one side of the busbar securing board facing the circuit board, through holes passing through said busbars and said busbar securing board are formed at the locations of both ends of each of said busbars so that the fasteners and the busbars are secured together with the busbar securing board, and the busbar securing board is assembled to the circuit board integrally with the plurality of busbars.

A large-current circuit board concerned with a further aspect of the invention comprises a plurality of fasteners positioned and secured beforehand on the circuit board, a plurality of busbars having a strip-like planar plate shapes for electrically connecting the plurality of fasteners, and a busbar securing board for electrically connectibly holding and securing the plurality of busbars with the plurality of fasteners on the circuit board, and at least some of the plurality of busbars are disposed on one side of the busbar securing board opposite to the circuit board, through holes passing through the busbars and the busbar securing board are formed at the locations of both ends of each of said busbars so that the fasteners and the bus bars are secured, the through holes passing through the busbar securing board have a diameter larger than the outside diameter of the end faces of the fasteners so that the busbars are abuttable on the end faces of said fasteners, and the busbar securing board is assembled to the circuit board integrally with the plurality of busbars.

A large-current circuit board concerned with another embodiment of the invention comprises a plurality of fasteners positioned and secured beforehand on the circuit board, a plurality of busbars having a strip-like planar plate shapes for electrically connecting the plurality of fasteners, and a plurality of busbar securing boards located on one surface side of the circuit board for electrically connectibly holding and securing the plurality of busbars with the plurality of fasteners on the circuit board, and the fasteners electrically connected with the busbars disposed on the busbar securing board farther than the other from the circuit board among the plurality of busbar securing boards pass through the holes provided in the busbar securing board disposed nearer to the circuit board.

A large-current circuit board embodying the present invention may further comprise elastic materials disposed between the busbar securing board surfaces and the plurality of busbars to securely hold the plurality of fasteners and the plurality of busbars.

A large-current circuit board embodying the present invention may comprise busbars made of a highly conductive material and formed in a strip-like planar shape, fasteners caulked and secured in holes formed in the predetermined positions of the busbars, and a circuit board fitted to the one-end portions of the fasteners by screw members via elastic members.

A large-current circuit board concerned with the invention may comprise busbars made of a highly conductive material and formed in a strip-like planar shape, fasteners caulked and secured in holes formed in the predetermined positions of said busbars, a circuit board fitted to the one-end portions of said fasteners by screw members via elastic members, and an insulating material fitted on the busbars between the busbars and the circuit board and having holes where the fasteners pass through, and the diameters of the holes formed in the insulating material are larger than the diameters of the holes formed in the busbars.

A large-current circuit board concerned with the present invention may use a plate-shaped insulating material and a plurality of busbars fitted integrally on the insulating material via a groove of a predetermined gap.

The large-current circuit board concerned with the present invention may have an insulating resin filled between a plurality of busbars.

Figure 22:
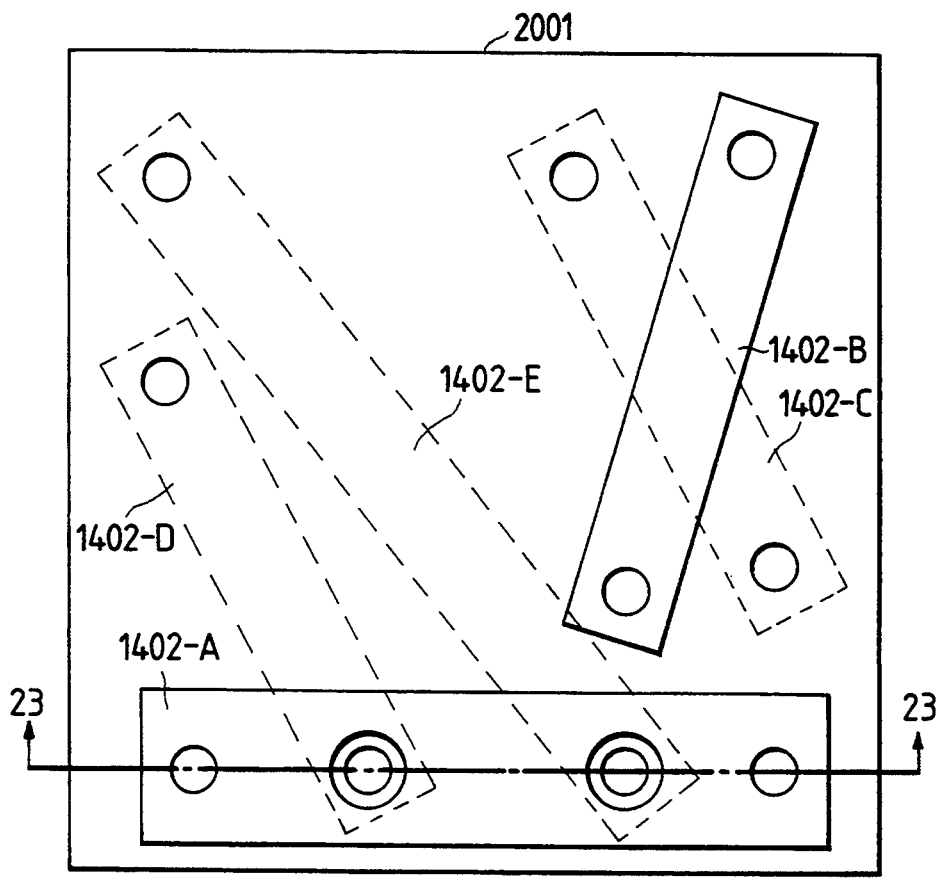

FIG. 22 is a diagrammatic plan arrangement diagram of a large-current circuit board according to a preferred embodiment of invention.

Figure 23:
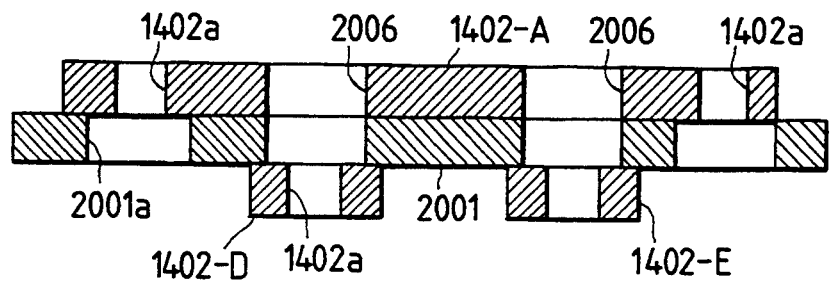

FIG. 23 is a sectional side view taken along the plane 23—23 of FIG. 22.

Figure 24:
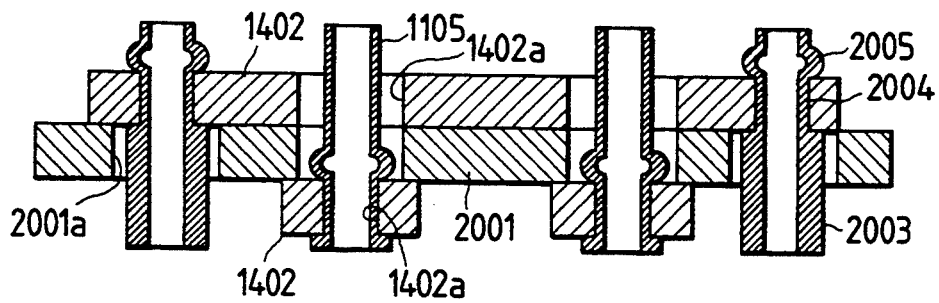

FIG. 24 is a diagrammatic sectional arrangement diagram of the large-current circuit board in FIG. 23 fitted with fasteners.

Figure 25:
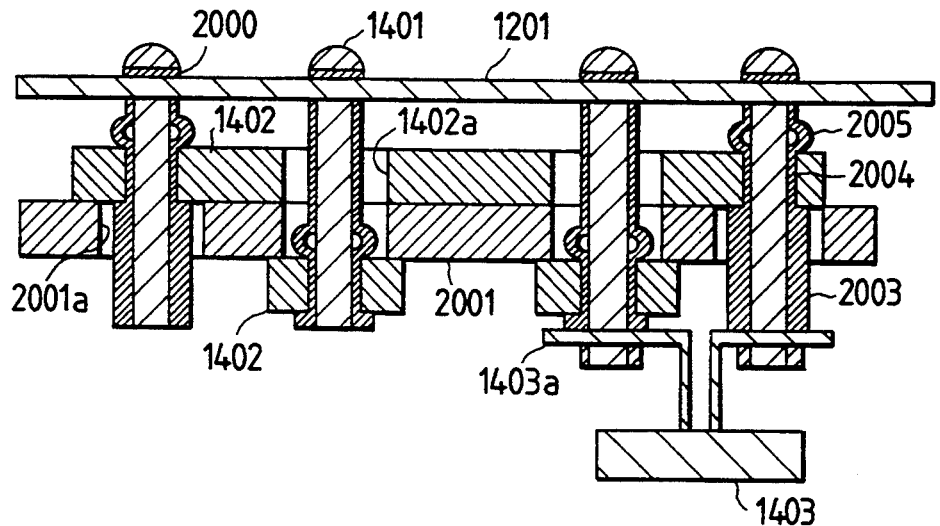

FIG. 25 is a diagrammatic sectional arrangement diagram of the large-current circuit board in FIG. 23 connected with a printed wiring board and an electronic component.

Figure 26:
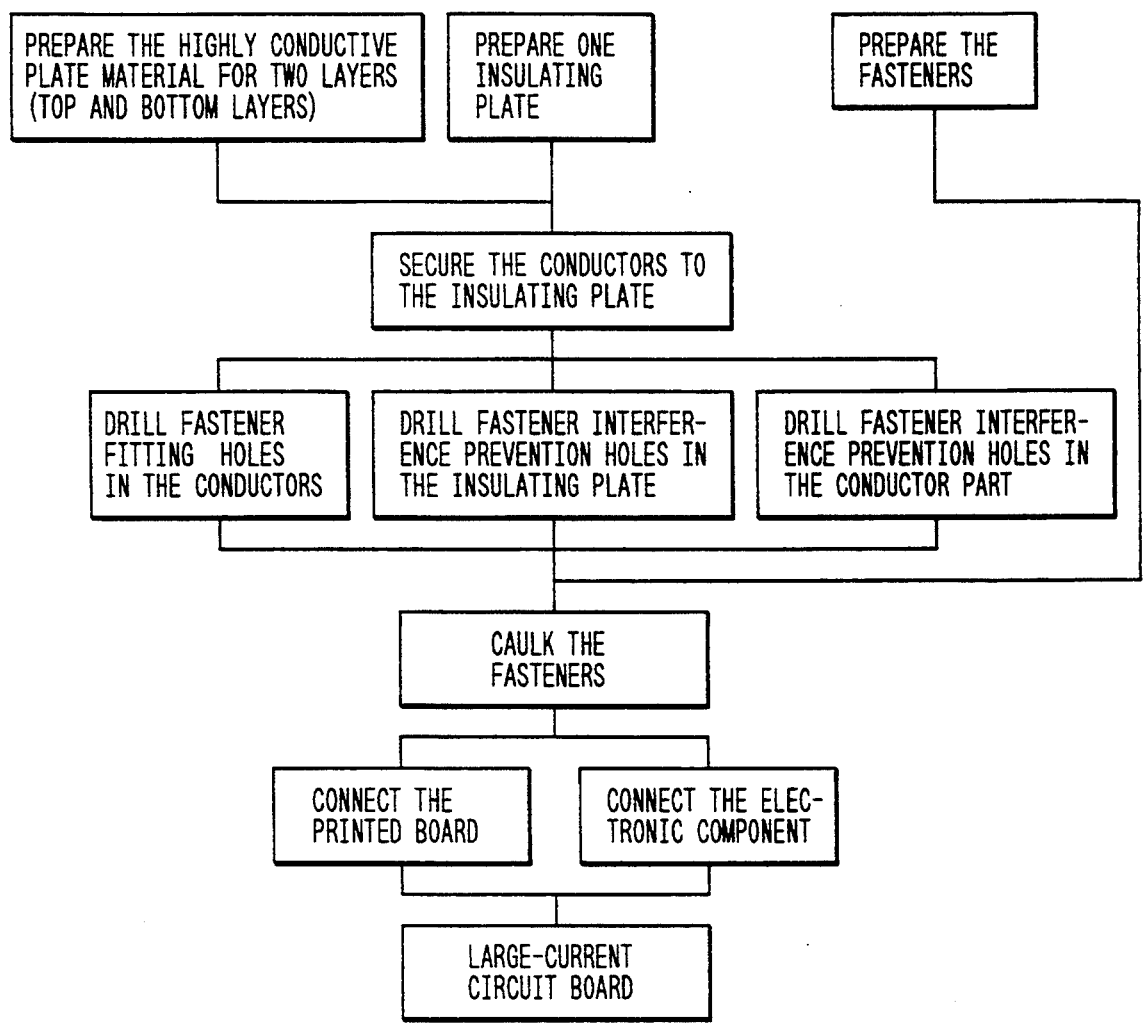

FIG. 26 is a manufacturing flowchart of the large-current circuit board shown in FIG. 25.

Figure 27:
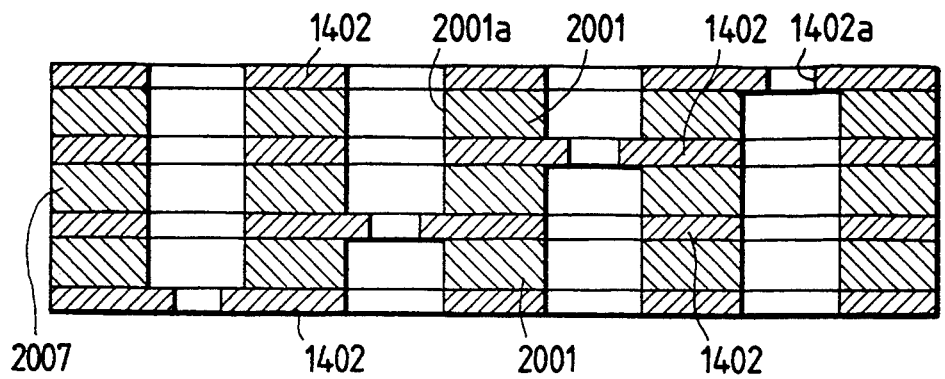

FIG. 27 is a diagrammatic plan arrangement diagram of a large-current circuit board according to a further embodiment of the invention.

Figure 28:
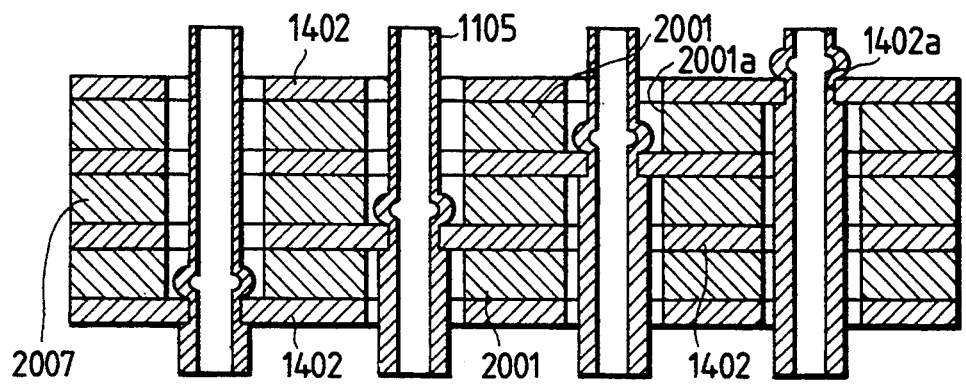

FIG. 28 is a diagrammatic sectional arrangement diagram of the large-current circuit board in FIG. 27 fitted with fasteners.

Figure 29:
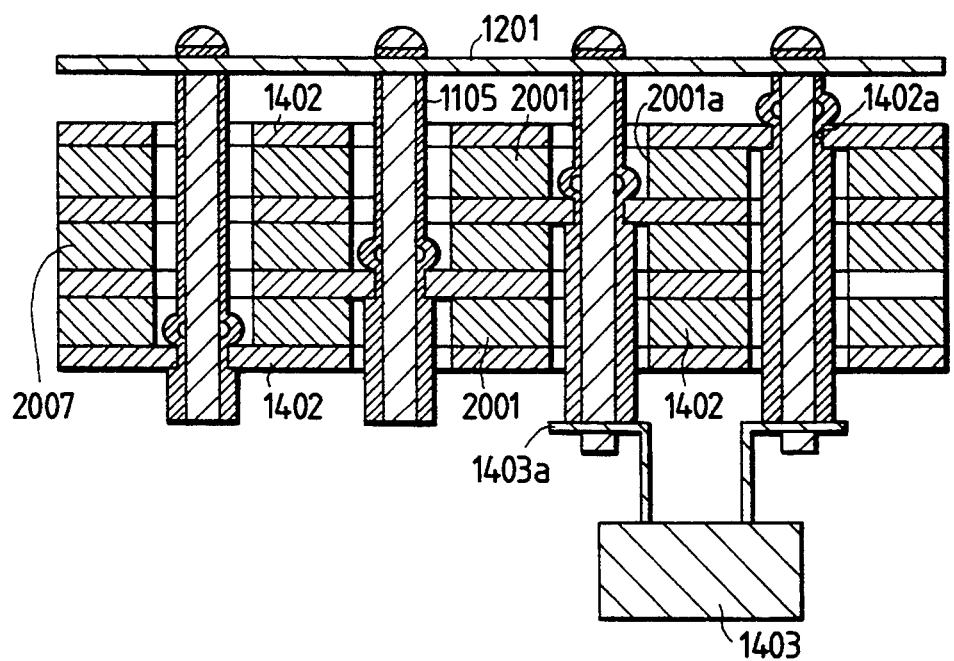

FIG. 29 is a diagrammatic sectional arrangement diagram of the large-current circuit board in FIG. 27 connected with a printed wiring board and an electronic component.

Figure 30:
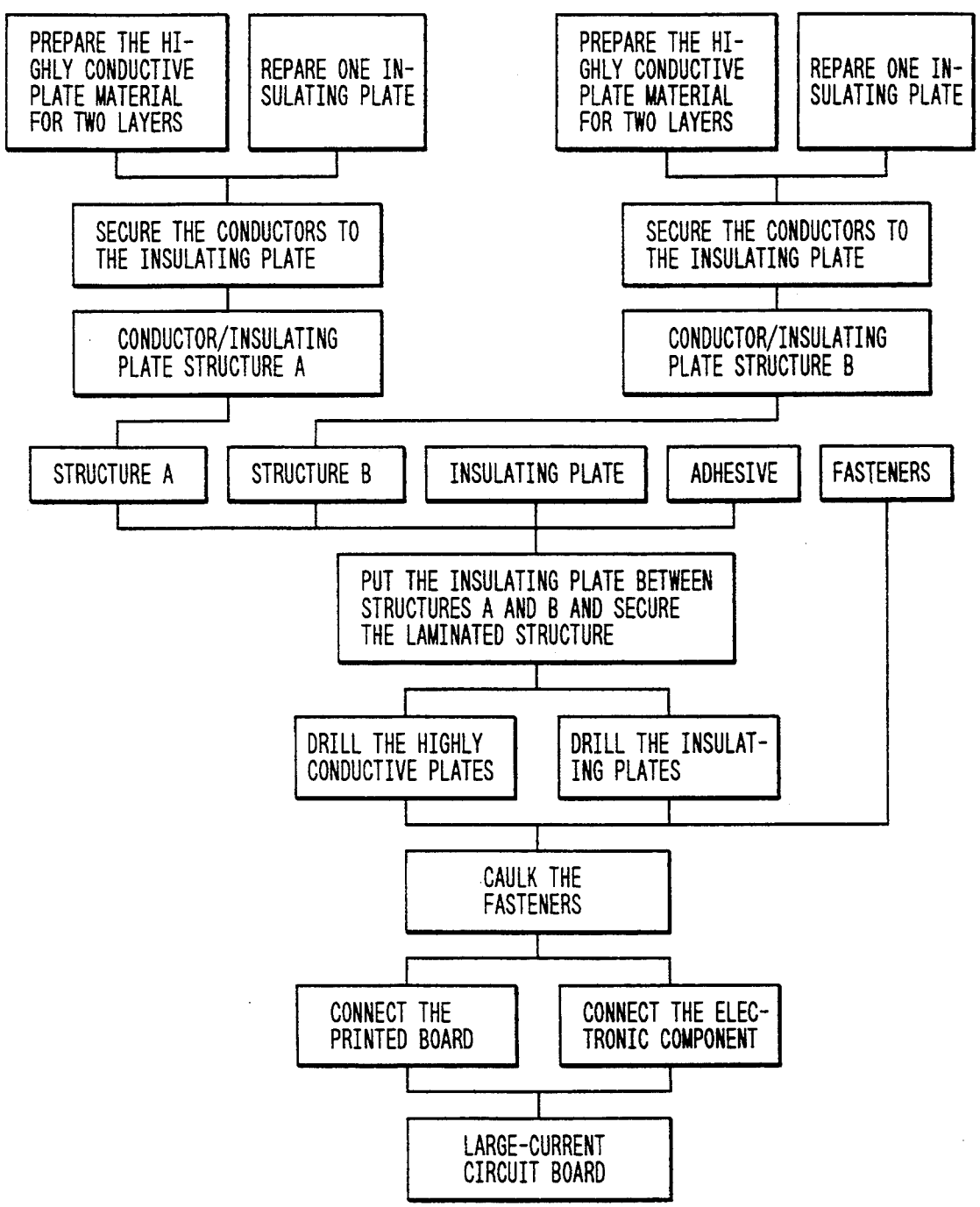

FIG. 30 is a manufacturing flowchart of the large-current circuit board shown in FIG. 27.

Figure 31:
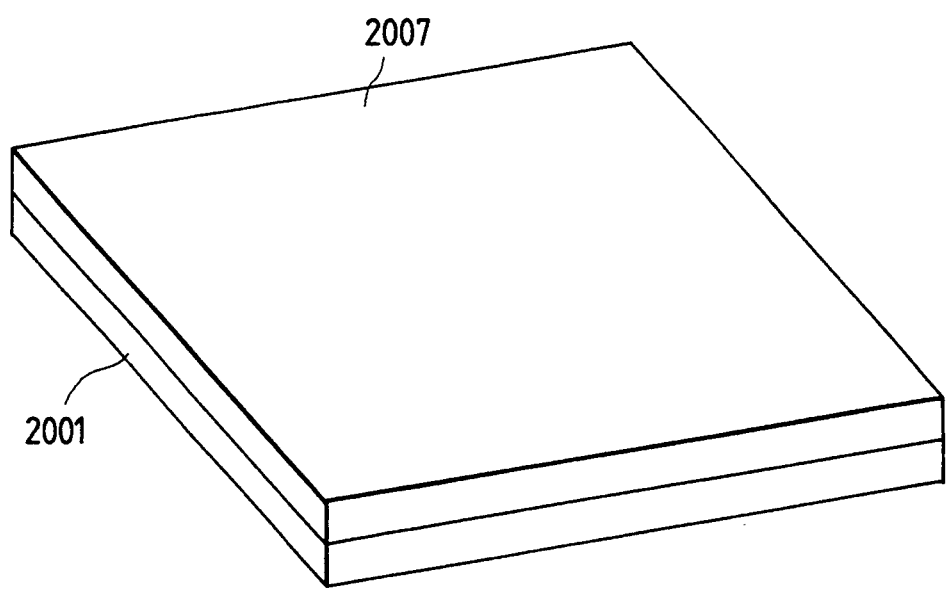

FIG. 31 is a perspective view for illustrating a preferred embodiment of the invention.

Figure 32:
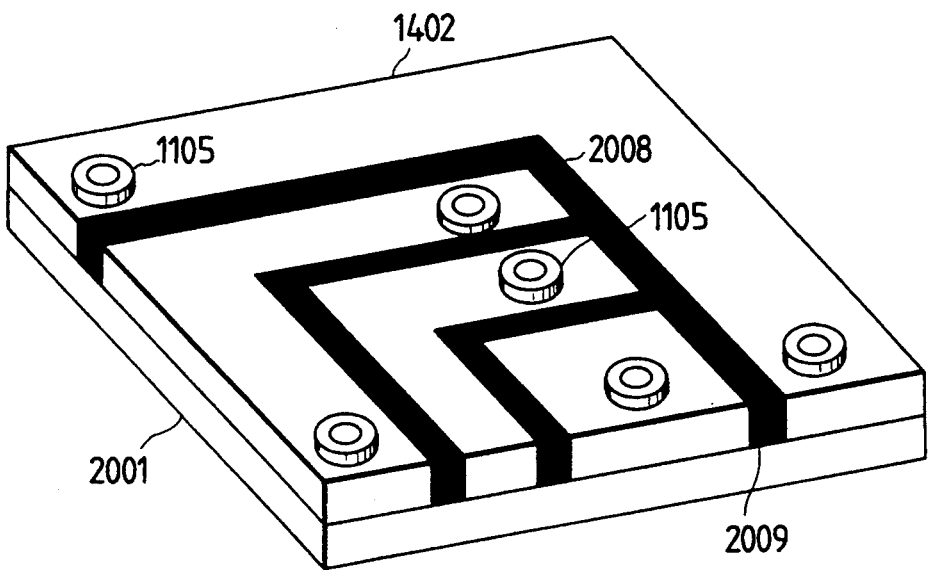

FIG. 32 is a perspective view for illustrating the preferred embodiment of the invention.

Figure 33:
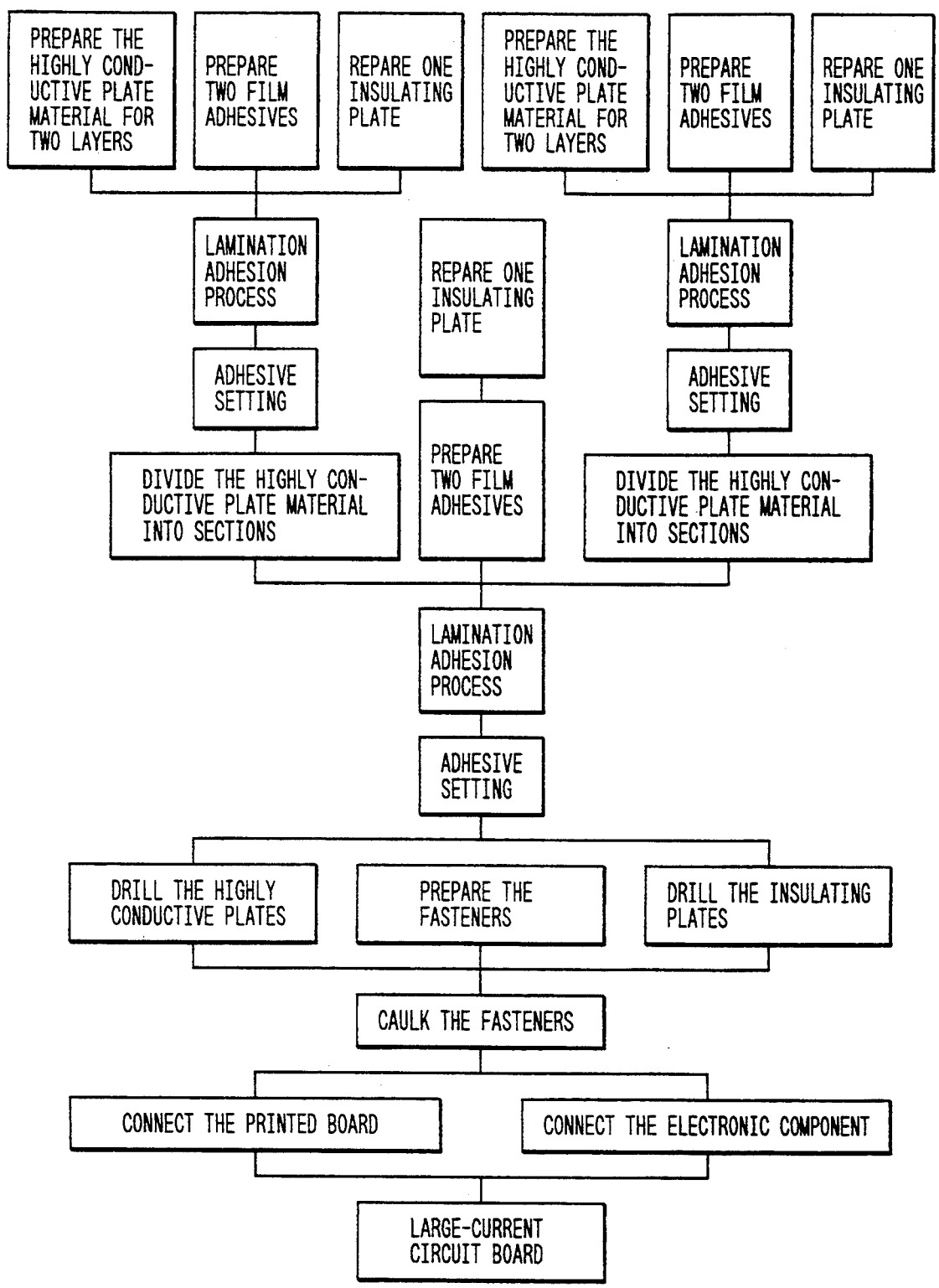

FIG. 33 is a manufacturing flowchart of the large-current circuit board of FIGS. 32 and 33.

Figure 34:
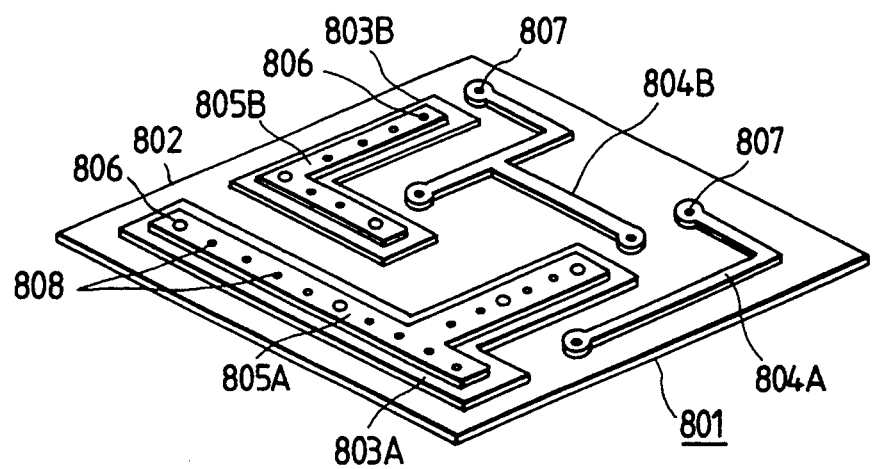

FIG. 34 is a perspective view illustrating a conventional art large-current circuit board (printed circuit board) disclosed in Japanese Laid-Open Patent Publication SH060-257191.

Figure 35:
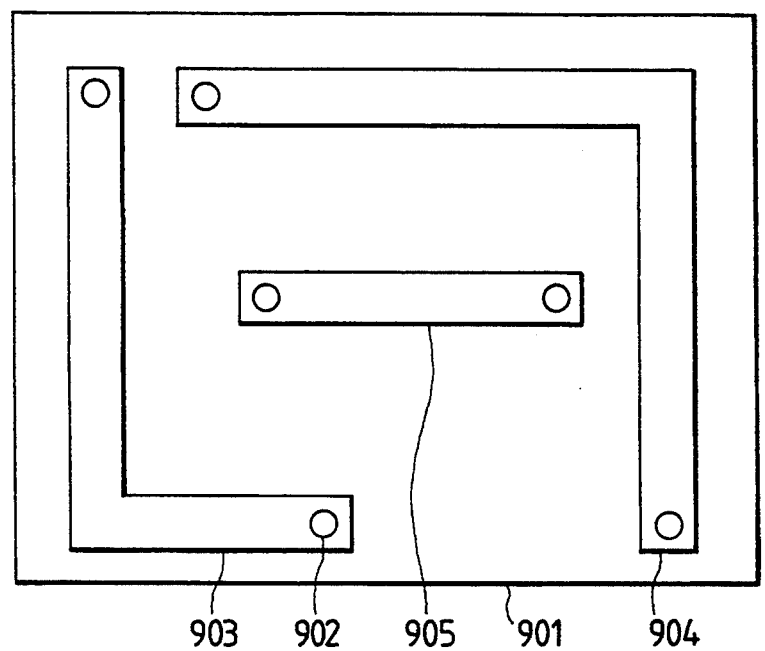

FIG. 35 is a plan view illustrating an example similar to the conventional art large-current circuit board (printed circuit board) disclosed in Japanese Laid-Open Patent Publication SH060-257191.

Figure 36:
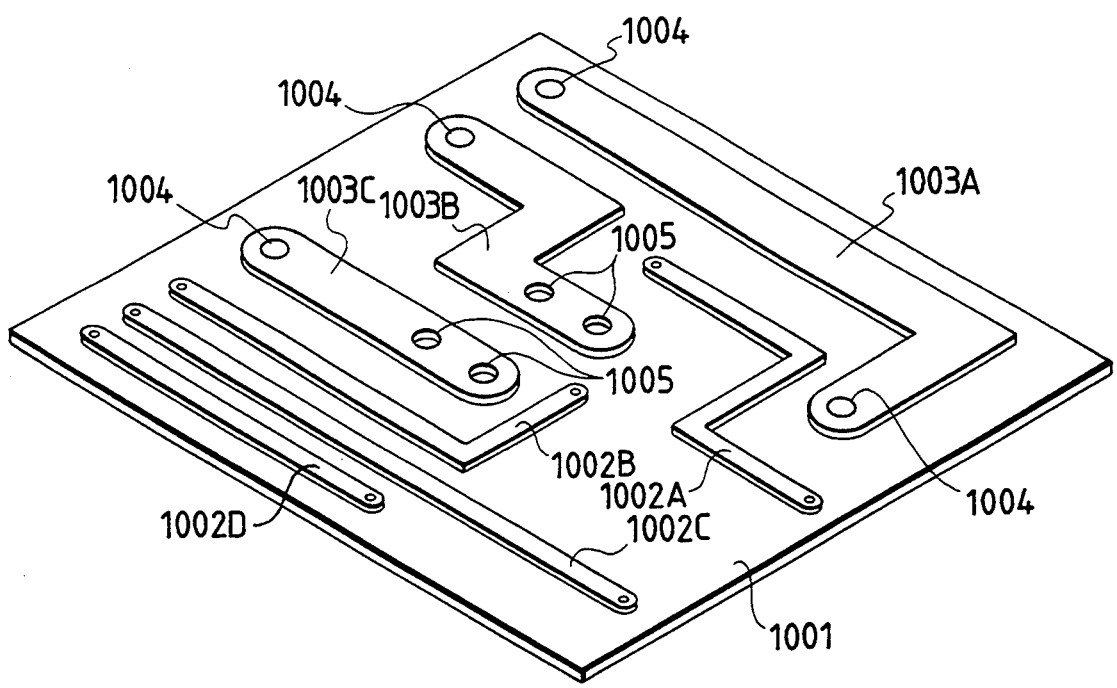

FIG. 36 is a perspective view illustrating a conventional art large-current circuit board disclosed in Japanese Laid-Open Utility Model Publication No. 45665 of 1990.

Figure 37:
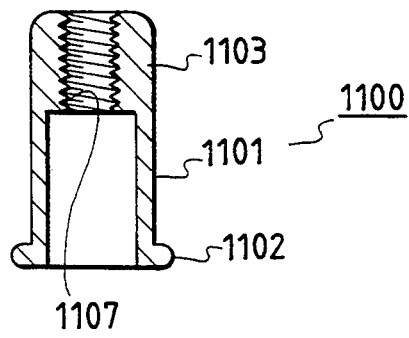

FIG. 37 illustrates a conventional fastener for use with large-current circuit board disclosed in Japanese Laid-Open Patent Publication HEI2-159787.

Figure 15:
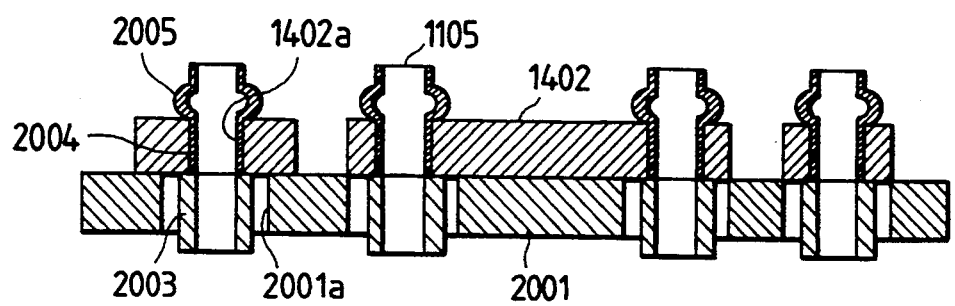
FIG. 15 is a diagrammatic sectional arrangement diagram of the large-current circuit board in FIG. 14 fitted with fasteners.
Figure 38:
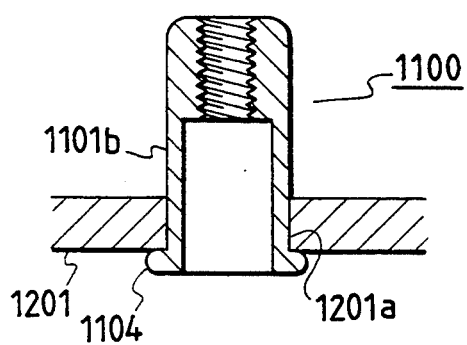

FIG. 38 is a diagrammatic view wherein the fastener for use with large-current circuit board shown in FIG. 15 has been inserted in a circuit board.

Figure 39:
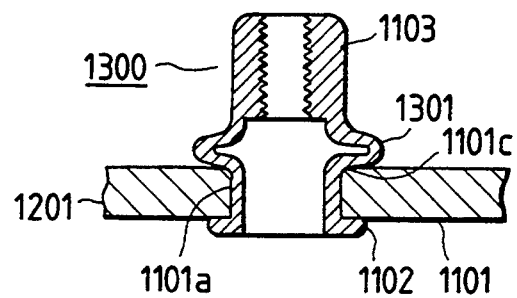

FIG. 39 is a diagrammatic view wherein the fastener for use with large-current circuit board shown in FIG. 15 has been caulked and fixed to the circuit board.

Figure 40:
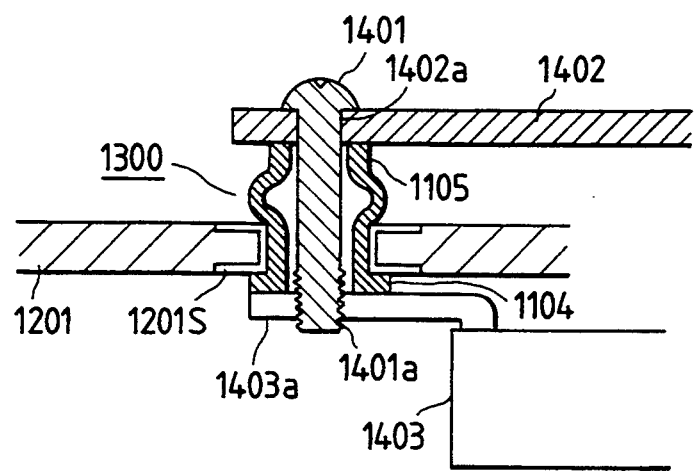

FIG. 40 is a diagrammatic view wherein the fastener for use with large-current circuit board disclosed in Japanese Laid-Open Patent Publication HEI2-159787 has been caulked and fixed to the circuit board and connected with a busbar or the like.

Figure 41:
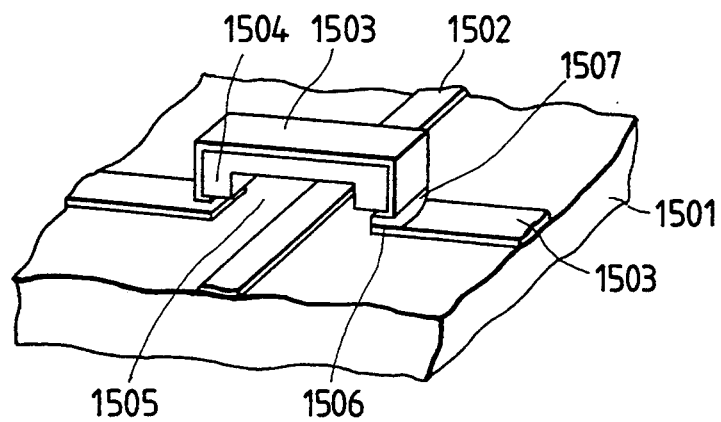

FIG. 41 is a perspective view illustrating a conventional art large-current circuit board disclosed in Japanese Laid-Open Patent Publication SH057-190335.

Figure 42A:
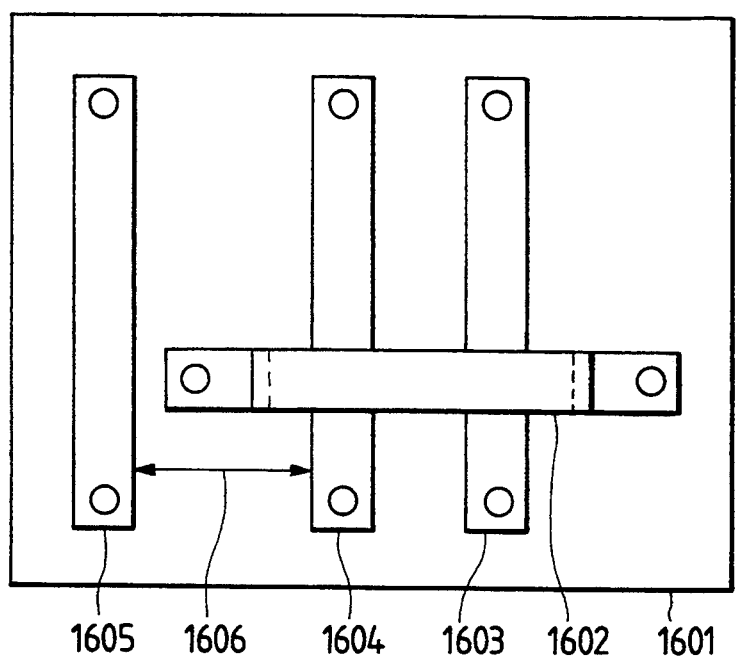
Figure 42B:
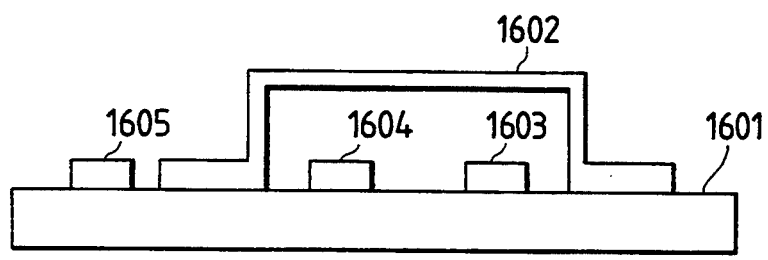

FIGS. 42a and 42b illustrate a conventional art large-current circuit board wiring example similar to that of the circuit board disclosed in Japanese Laid-Open Patent Publication SH060-190335.

DESCRIPTION OF THE PREFERRED EMBODIMENTS

A first embodiment of the invention will now be described with reference to FIGS. 1a and 1b. Throughout the drawings, reference characters identical to those in the conventional arts designate parts identical or corresponding to those in the conventional arts.

Figure 1A:
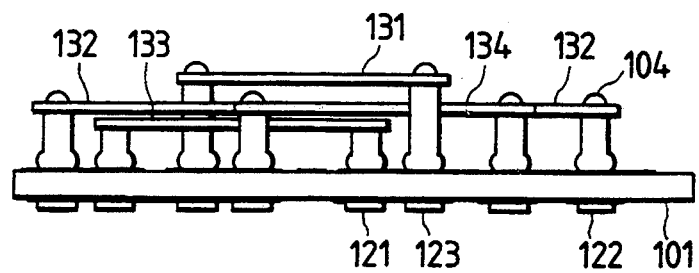
FIGS. 1a and 1b illustrate the diagrammatic arrangement of a large-current circuit board according to a preferred embodiment of the invention.
Figure 1B:
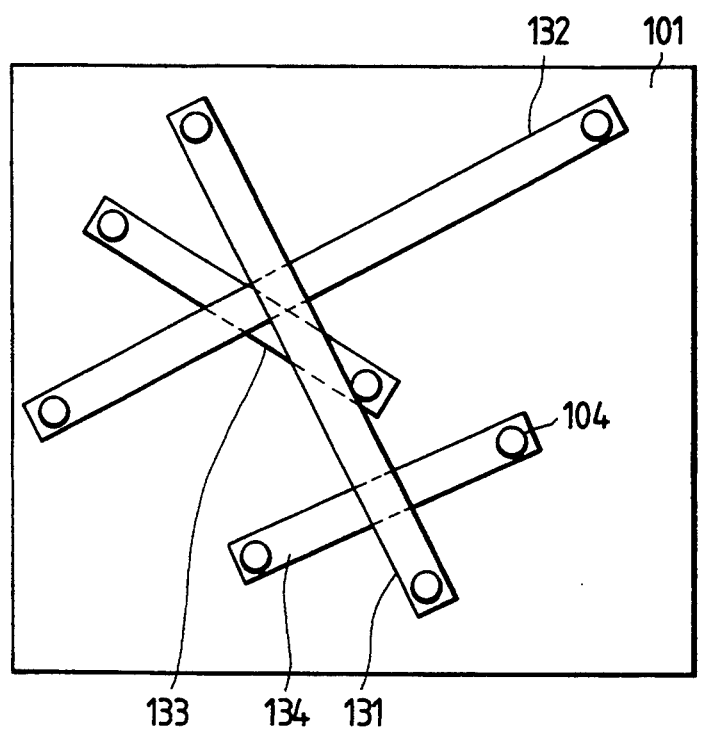

FIG. 1a is a side view illustrating the diagrammatic arrangement of a large-current circuit board according to Embodiment 1, and FIG. 1b is a plan view illustrating the same. In these drawings, the numeral 101 indicates a circuit board, 121, 122 and 123 designate fasteners, 131, 132, 133 and 134 denote busbars, and 104 represents fixing screws. Locking nuts for the fixing screws 104 have been omitted on the assumption that the fasteners 121 to 123 are threaded.

In FIGS. 1a and 1b, since the fasteners 121 to 123 on the board are different in height, the busbars 131 to 134 can be wired and connected in multi-layers. If the busbars used for wirings interfere with each other, changing the heights of the fasteners eliminates the obstacle to the wirings. Accordingly, as shown in FIG. 1b, the shape of the busbars used need only be straight. Also, insulation can be provided by spaces between the busbars 131 to 134.

A second embodiment of the invention will now be described with reference to FIGS. 2a and 2b. FIG. 2b is a side view illustrating the diagrammatic arrangement of a large-current circuit board according to Embodiment 2, and FIG. 2a illustrates a busbar structure fitted with busbars on one side of a busbar securing board facing a circuit board, wherein the busbars are fitted and secured to the circuit board together with the busbar securing board.

Figure 2A:
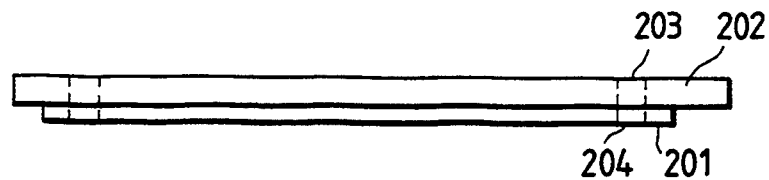
FIGS. 2a and 2b are side views illustrating the diagrammatic arrangement of a large-current circuit board according to a second embodiment of the invention.
Figure 2B:
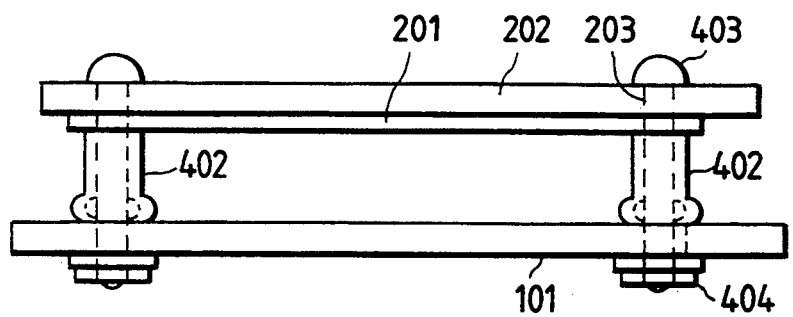

In FIG. 2a, 201 indicates bottom secured busbars, 202 denotes a busbar securing board, and 203 represents locking screw holes. In FIG. 2b, 101 indicates a circuit board, 402 designates fasteners for connection of the bottom busbars 202, 403 denotes locking screws, and 404 represents locking nuts.

The busbars 201 are affixed to the board 202 or secured by auxiliary screws (not shown) to form the busbar structure. The busbar structure is connected and secured to the fasteners 402 fitted to the circuit board 101.

The present embodiment, wherein the busbars are prefixed to the busbar securing board as shown in FIG. 2a, allows a number of busbars to be fitted together to the fasteners due to the busbar structure and to be electrically connected in groups by tightening the screws. Further, the busbars can be secured and connected by tightening the screws in one direction only, facilitating the automation of wiring and assembling.

A third embodiment of the invention will now be described with reference to FIGS. 3a and 3b. FIG. 3b is a side view illustrating the diagrammatic arrangement of a large-current circuit board according to Embodiment 3, and FIG. 3a illustrates a busbar structure fitted with busbars on one side of a busbar securing board opposite to a circuit board, wherein the busbars are fitted and secured to the circuit board along with the busbar securing board.

Figure 3A:
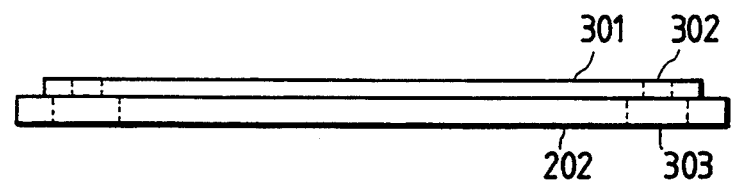
FIGS. 3a and 3b are side views illustrating the diagrammatic arrangement of a large-current circuit board according to a third embodiment of the invention.
Figure 3B:
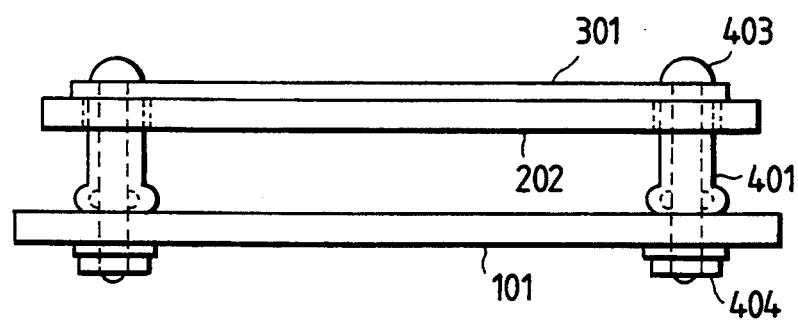

In FIG. 3a, 301 indicates top secured busbars and 202 denotes a busbar securing board. 302 designates locking screw holes bored in the top secured busbars 301, and 303 denotes fastener passing holes drilled in the busbar securing board 202. In FIG. 3b, 101 indicates a circuit board, 401 represents fasteners for connection of the top busbars, 403 denotes locking screws, and 404 represents locking nuts.

The busbars 301 are affixed to the busbar securing board 202 or secured by auxiliary screws (not shown). The busbars 301 and the busbar securing board 202 form a busbar structure. The busbar structure is connected and secured to the fasteners 401 fitted to the circuit board 101.

A fourth embodiment of the invention will now be described with reference to FIGS. 4a and 4b. FIG. 4b is a side view illustrating the diagrammatic arrangement of a large-current circuit board according to Embodiment 4, and FIG. 4a illustrates a busbar structure fitted with busbars on both sides of a busbar securing board, wherein the busbars are fitted and secured to the circuit board together with the busbar securing board.

Figure 4A:
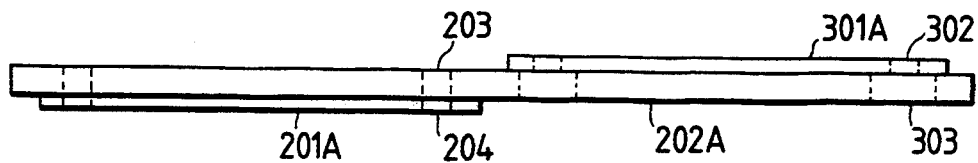
FIGS. 4a and 4b are side views illustrating the diagrammatic arrangement of a large-current circuit board according to a fourth embodiment of the invention.
Figure 4B:
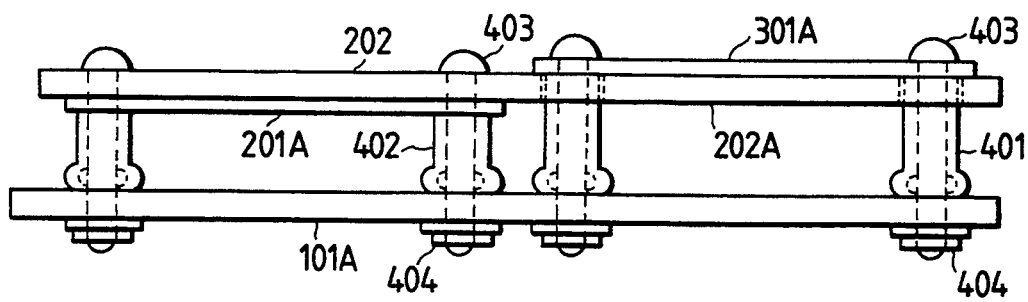

In FIG. 4a, the busbars are disposed and secured to both the top and bottom surfaces of a busbar securing board 202A. In FIG. 4b, the busbar structure shown in FIG. 4a is fitted to the fasteners 401, 402 fixed onto the circuit board 101. In FIG. 4a, the busbars 201 on the circuit board 101A side of the busbar securing board 202A fitted with the fasteners and the connection of the busbars 201 and the fasteners 402 are identical to those shown diagrammatically in FIGS. 2a and 2b, and the busbars 301 on the side of the busbar securing board 202A opposite to the circuit board fitted with the fasteners and the connection of the busbars 301 and the fasteners 401 are identical to those shown diagrammatically in FIGS. 3a and 3b.

The heights of the fasteners 401, 402 fixed onto the circuit board 101A are set according to the busbars 301, 201 connected respectively, and the busbars 301 secured to the top of the busbar securing board 202A are connected electrically with the ends of the fasteners 401 passing through the busbar securing board 202A.

Figure 5A:
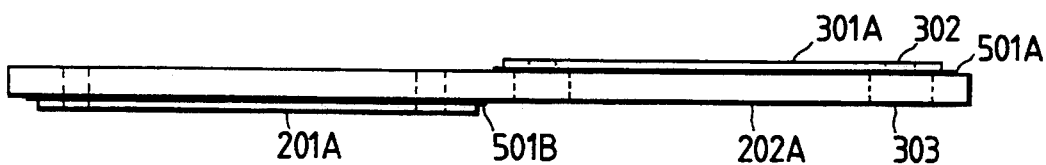
FIGS. 5a and 5b are side views illustrating the diagrammatic arrangement of a large-current circuit board according to a fifth embodiment of the invention.
Figure 5C:
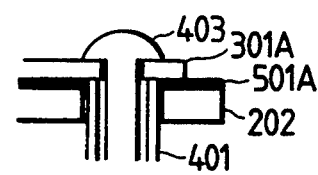
FIG. 5c is a partly sectional view showing the details of an installation portion by means of a screw.
Figure 5B:
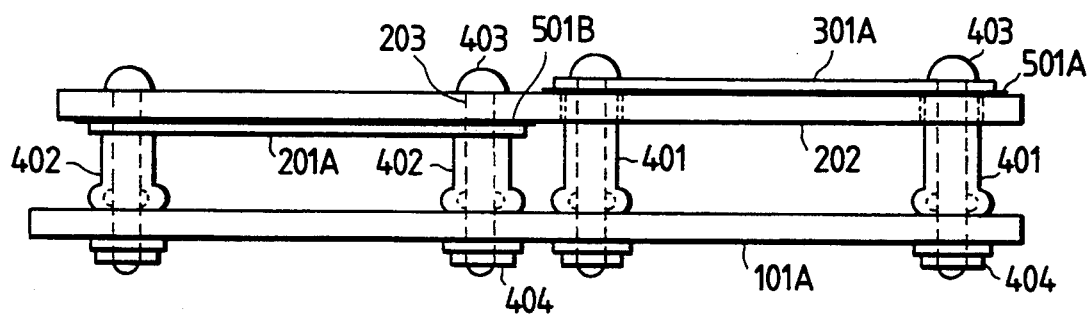

A fifth embodiment of the invention will now be described with reference to FIGS. 5a, 5b and 5c. FIG. 5b is a side view illustrating the diagrammatic arrangement of a large-current circuit board according to Embodiment 5. FIG. 5a shows that busbars have been fitted to both sides of a busbar securing board via rubber plates acting as elastic materials. FIG. 5c is a partly sectional view showing the details of an installation portion by means of a screw, 403 in FIG. 5b, wherein the busbars are fitted and secured to the circuit board along with the busbar securing board.

FIG. 5b illustrates an example wherein a busbar structure having rubber plates 501A, 501B shown in FIG. 5a is connected to the fasteners 401, 402 at heights that are different, when measured from the board secured portion prefixed to the circuit board 101A. In the connection example shown in FIG. 5b, if the fasteners 401, 402 should vary in height, the rubber plates 501 between the busbar securing board 202A and the busbars 202, 301 compensate for variations, enabling electrical connection of high reliability.

In Embodiment 5, the elastic materials are not limited to the rubber plates 501 indicated by way of example, and a washer or the like may be inserted into a step provided on each of screw inserting holes 20.

Figure 6A:
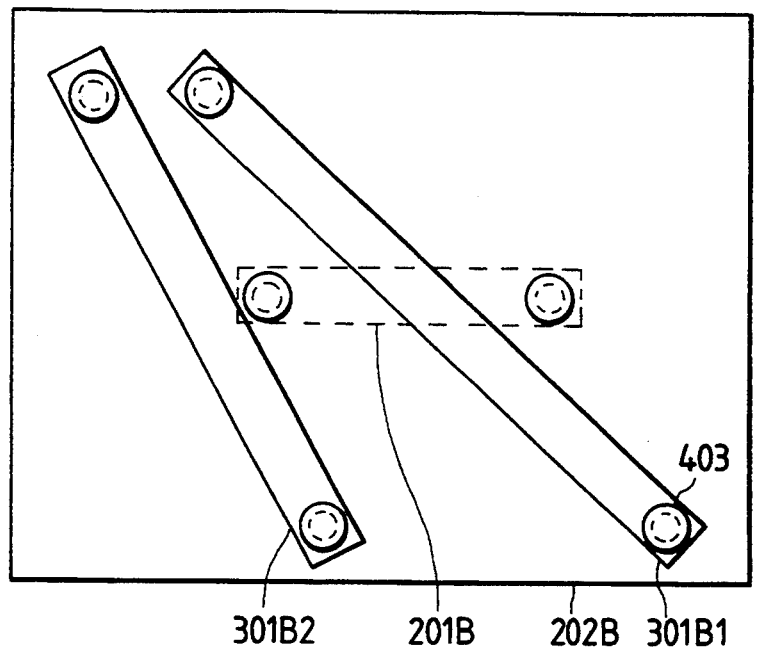
FIGS. 6a and 6b illustrate the diagrammatic arrangement of a large-current circuit board according to a sixth embodiment of the invention.
Figure 6B:
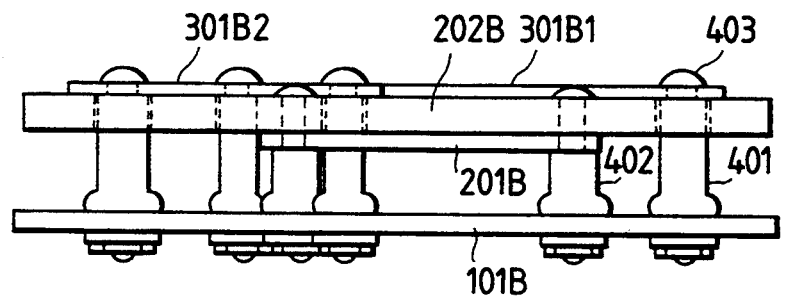

A sixth embodiment of the invention will now be described with reference to FIGS. 6a and 6b. FIG. 6a illustrates an arrangement example wherein the present invention has been embodied instead of the wirings using the conventional art hook-shaped busbars shown in FIG. 35, and FIG. 6b is a diagrammatic side view of FIG. 6a. In these drawings, a busbar structure comprising the busbars 201, 301 fitted to both sides of a busbar securing board 202B is fitted to the fasteners 401, 402 secured onto a circuit board 101B. This Embodiment 6 is essentially identical to the embodiments shown in FIGS. 4 and 5.

In FIGS. 6a and 6b, all wirings connected are the straight-line busbars 201B, 301B1, 301B2. The shapes of the busbars have been changed from a hook to a straight line, areas exclusively used for wirings reduced, and wiring areas increased by multi-layers, whereby material costs have been reduced, busbar machining costs reduced, wiring and assembling automated, and the wiring density increased.

Figure 7A:
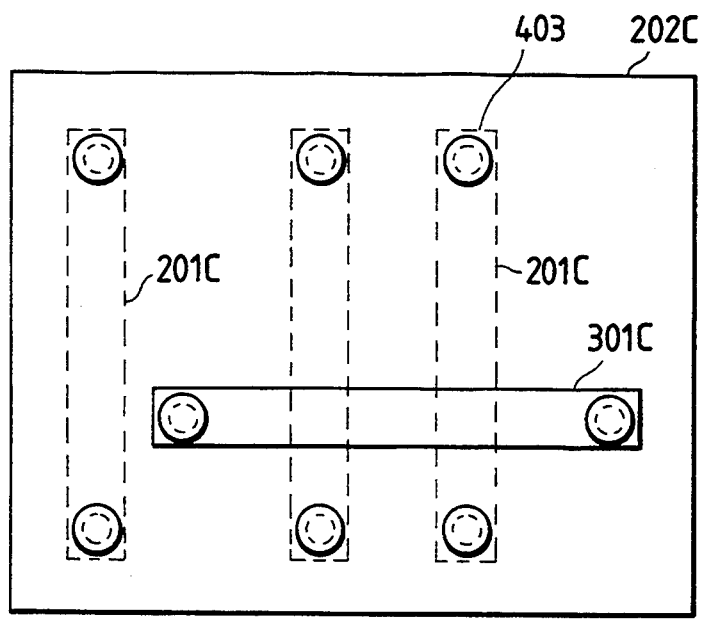
FIGS. 7a and 7b illustrate the diagrammatic arrangement of a large-current circuit board according to a seventh embodiment of the invention.
Figure 7B:
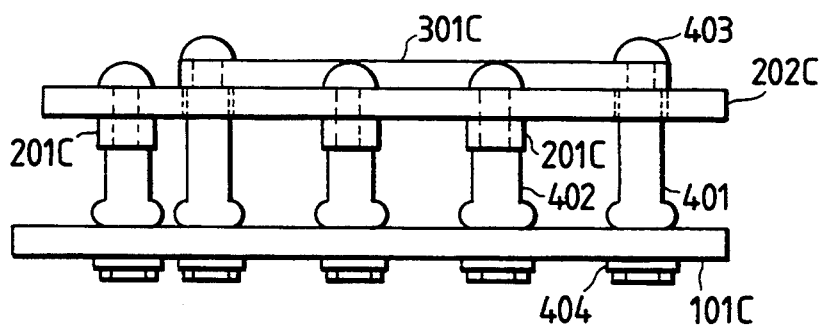

A seventh embodiment of the invention will now be described with reference to FIGS. 7a and 7b. FIG. 7a illustrates an arrangement example wherein the present invention has been embodied in place of the wirings using the conventional art bridge-shaped busbar shown in FIGS. 42a and 42b, and FIG. 7b is a diagrammatic side view of FIG. 7a. In these drawings, a busbar structure comprising the busbars 201, 301 fitted to both sides of a busbar securing board 202C is fitted to the fasteners 401, 402 secured onto a circuit board 101C. This Embodiment 7 is essentially identical to the fourth, fifth and sixth embodiments previously described.

In FIGS. 7a and 7b, all wirings connected are straight-line busbars 201, 301. Hence, the dimensional restrictions on the manufacturing of the bridge-shaped busbar have been eliminated whereby compact size has been achieved, and wiring areas have been increased whereby material costs have been reduced, busbar machining costs reduced, wiring and assembling automated, and the wiring density increased.

Figure 8:
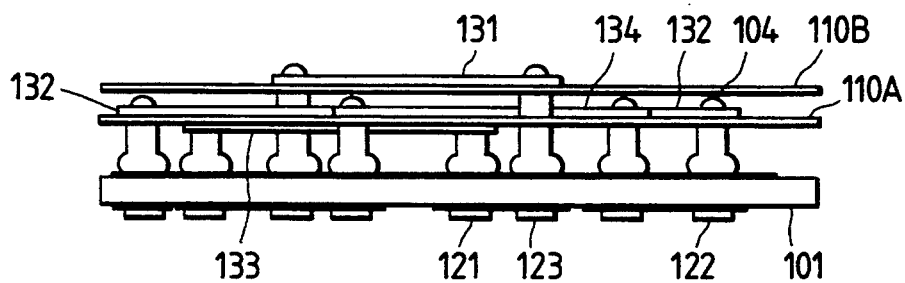
FIG. 8 is a side view illustrating the diagrammatic arrangement of a large-current circuit board according to an eighth embodiment of the invention.
Figure 9A:
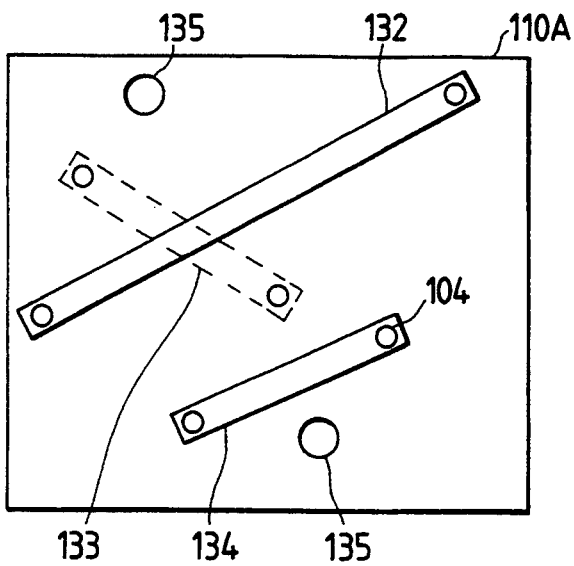
FIGS. 9a and 9b are a plan view and a side view of a busbar securing board 110A shown in FIG. 8.
Figure 9B:
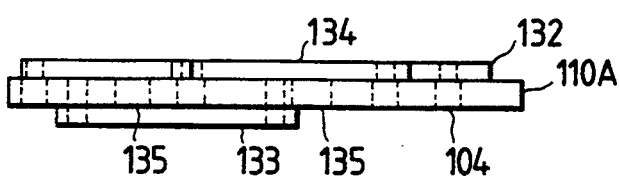
Figure 10A:
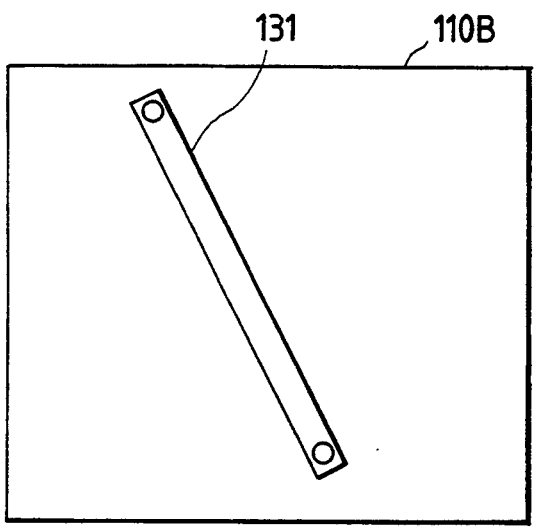
FIGS. 10a 10b are a plan view and a side view of a busbar securing board 110B shown in FIG. 8.
Figure 10B:

An eighth embodiment of the invention will be described with reference to FIGS. 8 to 11. FIG. 8 is a side view showing an arrangement example which embodies the present invention, wherein a circuit equivalent to the circuit in Embodiment 1 shown in FIG. 1a is constructed by using busbar securing boards. In FIG. 8, 110A and 110B indicate busbar securing boards. FIGS. 9a, 9b and FIGS. 10a, 10b illustrate that the busbars 131 to 134 are fitted to the busbar securing boards 110A, 110B, wherein the busbar securing board 110A which is first fitted to the circuit board 101 is fitted with the busbars on its both surfaces, and the busbar securing board 110B which is fitted subsequently is fitted with the busbar on its one surface (top surface in FIG. 10b).

Figure 11:
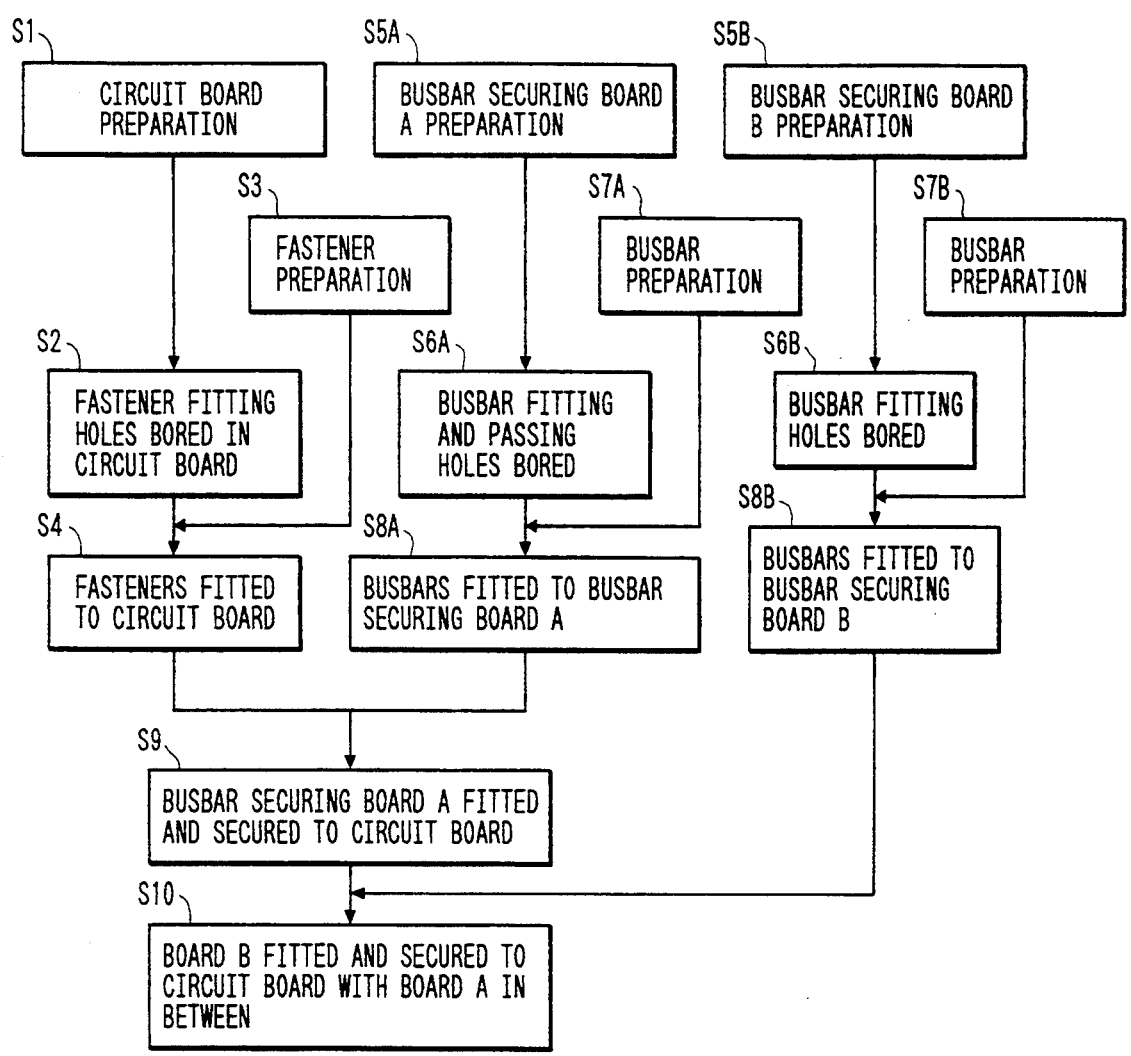
FIG. 11 is a flowchart illustrating a process of constructing the large-current circuit board shown in FIG. 8.

FIG. 11 is a flowchart showing a sequence of fitting the busbar securing boards 110A, 110B and assembling the boards. A board assembling process will now be described in accordance with this flowchart. It should be noted that the circuit board 101, the busbar securing board 110A and the busbar securing board 110B are designed to be in layers in order.

At step S1 in FIG. 11, the circuit board 101 is prepared. Used as the material of the circuit board is any of commercially available printed circuit board materials such as copper-clad glass-epoxy laminates and polyimide laminates. Then, at step S2, fastener fitting holes are bored at predetermined positions of the circuit board 101. In the meantime, at step S3, the heights of the busbars fitted to the circuit board 101 are preset and fasteners corresponding to said heights are prepared.

A process of fitting the busbars to the busbar securing boards will now be described. At step S5A, the busbar securing board 110A is prepared. The busbar securing board uses, for example, an insulating thermosetting resin plate, e.g., a glass-epoxy plate, a glass-filled polyester resin plate, a polyimide resin plate or phenol laminates, or an insulating thermoplastic resin plate, e.g., polyculfon. Subsequently, at step S6, holes are bored at predetermined positions of the busbar securing board 110A. Namely, for the busbar 133 disposed on the circuit board side of the busbar securing board 110A, the holes are bored at the predetermined positions determined by the position of the busbar 133 at a hole diameter through which the fixing screw 104 passes, and for the busbars 132, 134 disposed on the side opposite to the circuit board, the holes are bored at the predetermined positions determined by the arrangement of the busbars 132, 134 at a hole diameter through which the fastener end can pass. Meanwhile, at step S7A, the busbars 132 to 134 of predetermined lengths having threaded holes at both ends are prepared. Then, at step SSA, the busbars 132 to 134 are fitted and secured at the predetermined positions of the busbar securing board 110A by adhesion using adhesive or double-coated adhesive tape or by screwing.

At steps S5B to S8B, the busbar securing board 110B is prepared and bored, and in the meantime, the busbar 131 is prepared and fitted to the predetermined position of the busbar securing board 110B in the same procedure as described at steps S5A to S8A.

Subsequently, at step S9, the busbar securing board 110A is fitted and secured to the circuit board 101 via the fasteners, and further at step S10, the busbar securing board 110B is fitted and secured.

At step S7A, assuming that the thickness of the busbar is t, the thickness of the board area (board+adhesive member+elastic member) of the busbar securing board is d, and the height of the fasteners for the electrical connection of the busbar 133 disposed on the circuit board side of the busbar securing board is h, height H1 of the fasteners for the electrical connection of the busbars 132, 134 disposed on the side opposite to the circuit board 101 is $H1 = h + t + d$. Meanwhile, at step S7B, the busbar 131 is disposed only on the side of the busbar securing board 110B opposite to the circuit board 101, and height H2 of the fasteners for the electrical connection of said busbar 131 is $H2 > h + 2t + 2d$. When the busbars are disposed on both sides of the busbar securing board 110B, not only on the side of the busbar securing board 110B opposite to the circuit board 101, the height of $H3 > h + 3t + 2D$ is required to prevent the busbars disposed on the busbar securing board 110A and the busbar securing board 110B from interfering with each other.

While Embodiment 8 shows an example wherein two busbar securing boards are arranged in layers above the circuit board, the addition of a process corresponding to steps S5B to SSB and step S10 allows three or more busbar securing boards to be arranged in layers. By omitting steps S5B to S8B and step S10, a circuit board with one busbar securing board can be constructed.

A ninth embodiment of the invention will now be described in accordance with FIG. 12. In this drawing, 1105 indicates a fastener manufactured by a copper material, 1402 designates a busbar manufactured by a copper material, 2000 represents an elastic member, e.g., a spring washer, 803A denotes a printed wiring of a printed wiring board, 2001 indicates an insulating material, for example an insulating plate, and 2001a represents a hole provided in the insulating plate 2001 to prevent caulking interference with the fastener 1105. Namely, the diameter of the hole 2001a provided in the insulating plate 2001 is formed to be larger than the diameter of a hole 1402a provided in the busbar 1402. The other parts are identical to those of the conventional apparatus in FIG. 40 and will not be described here.

When the apparatus according to the present embodiment designed as described above is compared with the conventional apparatus shown in FIG. 40, the material of the caulked portion of the fastener 1105 is only the copper material in the apparatus according to the present embodiment, while the part of the printed wiring board 1201 including the insulating layer is caulked in the conventional apparatus shown in FIG. 40.

Generally, for example, when a 100A current is caused to flow, the busbar 1402 for causing a large current to flow often has a conductor width of approximately 10 to 20 mm for a copper material of approximately 1 mm thickness and often has a conductor width of approximately 5 to 15 mm for a copper material of approximately 2 mm thickness. When a 200A current is caused to flow, the busbar 1402 often has a conductor width of approximately 10 to 30 mm for a copper material of approximately 2 mm thickness and often has a conductor width of approximately 7 to 25 mm for a copper material of approximately 3 mm thickness. Therefore, this indicates that generally the busbar 1402 in the large-current circuit is considerably thick as compared to the copper material of approximately 0.018 to 0.105 mm thickness, which is a conductor for constituting the printed wiring board 1201.

Also, since a compression force of approximately several hundred kg is applied to caulk and secure the fastener 1105, the copper material of approximately 0.018 to 0.105 mm thickness, or the conductor which constitutes the printed wiring 803A of the printed circuit board 1201, cannot endure the compression force at the time of caulking. Accordingly, when the fastener 1105 is caulked and secured to the printed wiring board 1201 for electrical connection, there is no other way but to caulk and secure a structure of a glass epoxy base material and a copper film. However, the copper busbar 1402 for causing a large current to flow is thick enough to endure the compression force of several hundred kg when the fastener 1105 is caulked and secured, allowing an excellent caulked product to be formed.

Also, as described above, in the apparatus according to the present embodiment, the fastener 1105 is caulked and secured directly to the busbar 1402 for causing a large current to flow and the printed wiring board 1201 is connected at the top end of the fastener 1105 under the pressure of the screw 1401 tightening force and the spring washer 2000, whereby the spring washer 2000 compensates for a change in thickness of the resin layer of the printed wiring board 1201 part to keep applying predetermined pressure, thereby ensuring highly reliable electrical connection.

Figure 12:
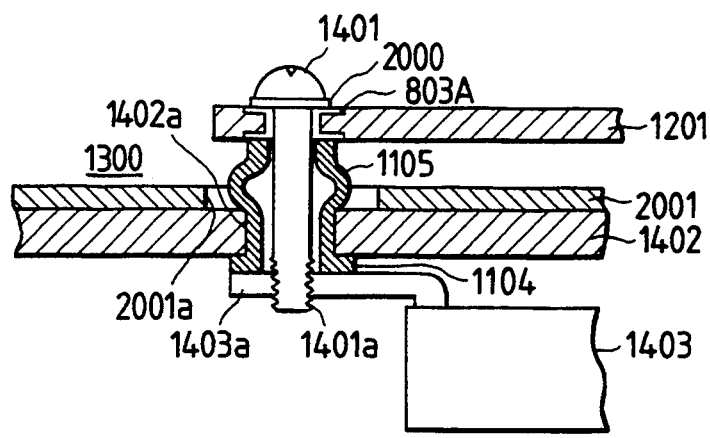
FIG. 12 is a side view illustrating the diagrammatic arrangement of a large-current circuit board according to a preferred embodiment of the invention.

Table 1 shows the results of heat cycle treating the connection resistance of the fastener 1105 and the fastener securing part in the apparatus according to the ninth embodiment shown in FIG. 12. In the table, change ratios resulting from the heat cycle treatment of the electrical connection resistance of the fastener 1105 and the fastener securing part in the apparatus according to the present embodiment shown in FIG. 12 and the conventional apparatus in FIG. 40 are found. The initial value item and the number of heat cycles are indicated at the top of this Table 1, and the relative values of measurement results at the initial value of 100 in respective arrangement examples are indicated on the two bottom lines. It is to be understood that the change ratios of the apparatus according to the present embodiment were found by the heat cycle treatment of the electrical connection resistance of the fastener 1105 and the busbar 1402, and the change ratios of the conventional apparatus were obtained by the heat cycle treatment of the electrical connection resistance of the fastener 1105 and the printed wiring 803A of the printed wiring board 1201 at the initial value of 100, respectively. The heat cycle condition is the cycle of −40° C./15 minutes to +125° C./15 minutes.

As is obvious in Table 1, the changes caused by the heat cycle of the connection resistance of the connecting portion between the fastener 1105 and the busbar 1402 acting as the fastener securing part is superior in the connection arrangement of the apparatus according to the present embodiment than that of the conventional apparatus. Namely, when the printed wiring board 1201 and the busbar 1402 are connected by the fastener 1105 which can form a plurality of electrical connections including caulking and securing, the design of securing the fastener 1105 to the busbar 1402 is effective for the improvement of connection reliability.

TABLE 1

|  | Initial value | 100 times | 300 times | 1000 times | 3000 times |
| --- | --- | --- | --- | --- | --- |
| Embodiment apparatus in FIG. 12 | 100 | 104 | 106 | 107 | 108 |
| Conventional apparatus in FIG. 40 | 100 | 149 | 173 | 186 | 195 |

Figure 13:
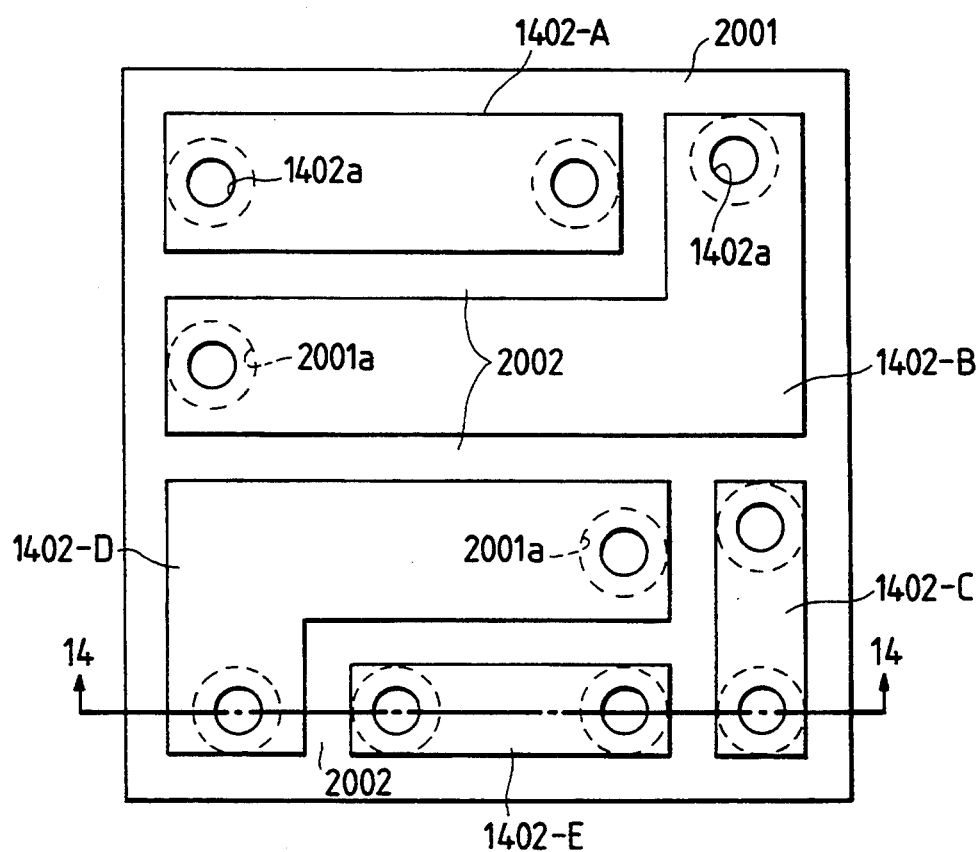
FIG. 13 is a diagrammatic plan arrangement diagram of the large-current circuit board according to the invention.
Figure 14:
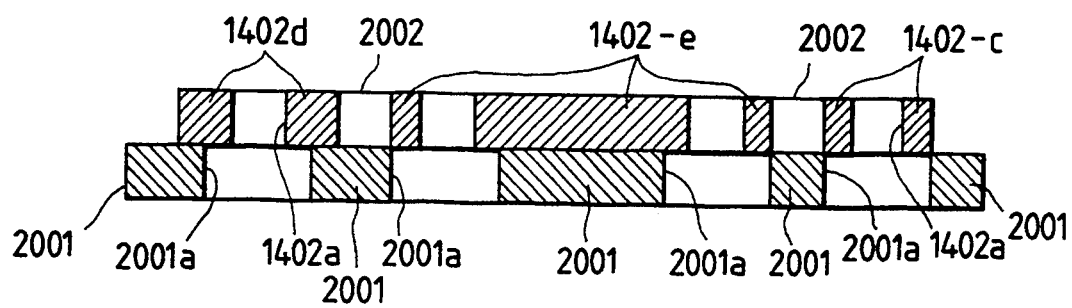
FIG. 14 is a sectional side view taken along the line 14—14 of FIG. 13.
Figure 16:
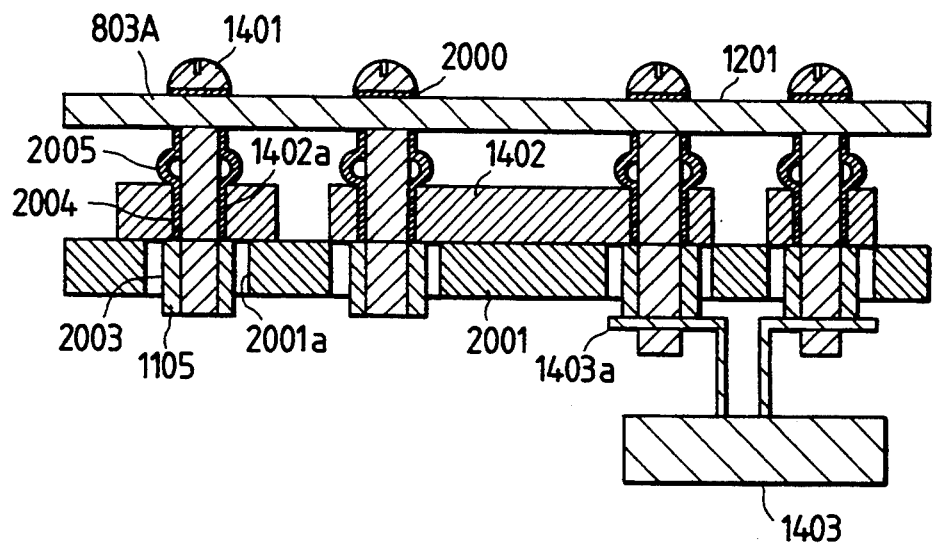
FIG. 16 is a diagrammatic sectional arrangement diagram of the large-current circuit board in FIG. 15 connected with a printed wiring board and an electronic component.

A tenth embodiment, which is an alternative to the ninth embodiment of the invention, will now be described in accordance with FIGS. 13 to 16. FIG. 13 is a diagrammatic plan arrangement diagram of a circuit board, FIG. 14 is a sectional side view taken along the plane 14—14 of FIG. 13, FIG. 15 is a diagrammatic sectional arrangement diagram of the circuit board fitted with the fasteners 1105, and FIG. 16 is a diagrammatic sectional arrangement diagram of the circuit board connected with the printed wiring board 1201 and an electronic component 1403. Referring to FIGS. 13 and 14, 1402-A, 1402-B, 1402-C, 1402-D and 1402-E indicate busbars manufactured by a copper material, and 2002 designates an air gap between the busbars 1402.

In FIGS. 15 and 16, 2003 denotes a flange portion of the fastener 1105, 2004 represents a cylindrical portion of the fastener 1105, and 2005 indicates a caulking-deformed portion of the fastener 1105. The other parts are identical to those described in FIG. 12 and will not be described here.

In the apparatus according to the present tenth embodiment, the plurality of busbars 1402-A, 1402-B, 1402-C, 1402-D and 1402-E are disposed and secured to the insulating plate 2001 at an insulation distance 2002 from each other as shown in FIG. 13 to permit the wiring of the large-current circuit and the busbars 1402 are provided with fastener securing holes 1402a in the fastener 1105 securing portions to allow the connection of the fasteners 1105 in desired portions.

Further, the insulating plate 2001 is provided with an interference prevention hole 2001a in each fastener 1105 securing portion to prevent the interference of the flange portion 2003 of the fastener 1105 with the insulating plate 2001, whereby the flange portion 2003 of the fastener 1105 makes direct contact with the busbar 1402 to allow the fastener 1105 to be caulked and secured to the busbar 1402. In this case, the busbars 1402 are secured to the insulating plate 2001 to ensure ease of positioning the fastener fitting holes and the interference prevention holes drilled in the insulating plate 2001 shown in FIGS. 13 and 14 at the time of their drilling, and the busbars 1402 are integrated by the insulating plate 2001 to ensure that the busbars 1402 can be handled extremely easily. Further, the plurality of fasteners 1105 can be caulked together to the busbars 1402 shown in FIG. 15 to sharply improve workability, and the arrangement shown in FIG. 16 easily permits the electrical connections of the busbars 1402 and the fasteners 1105, of the printed wiring board 1201 and the fasteners 1105, and of the electronic component 1403 and the fasteners 1105.

Figure 17:
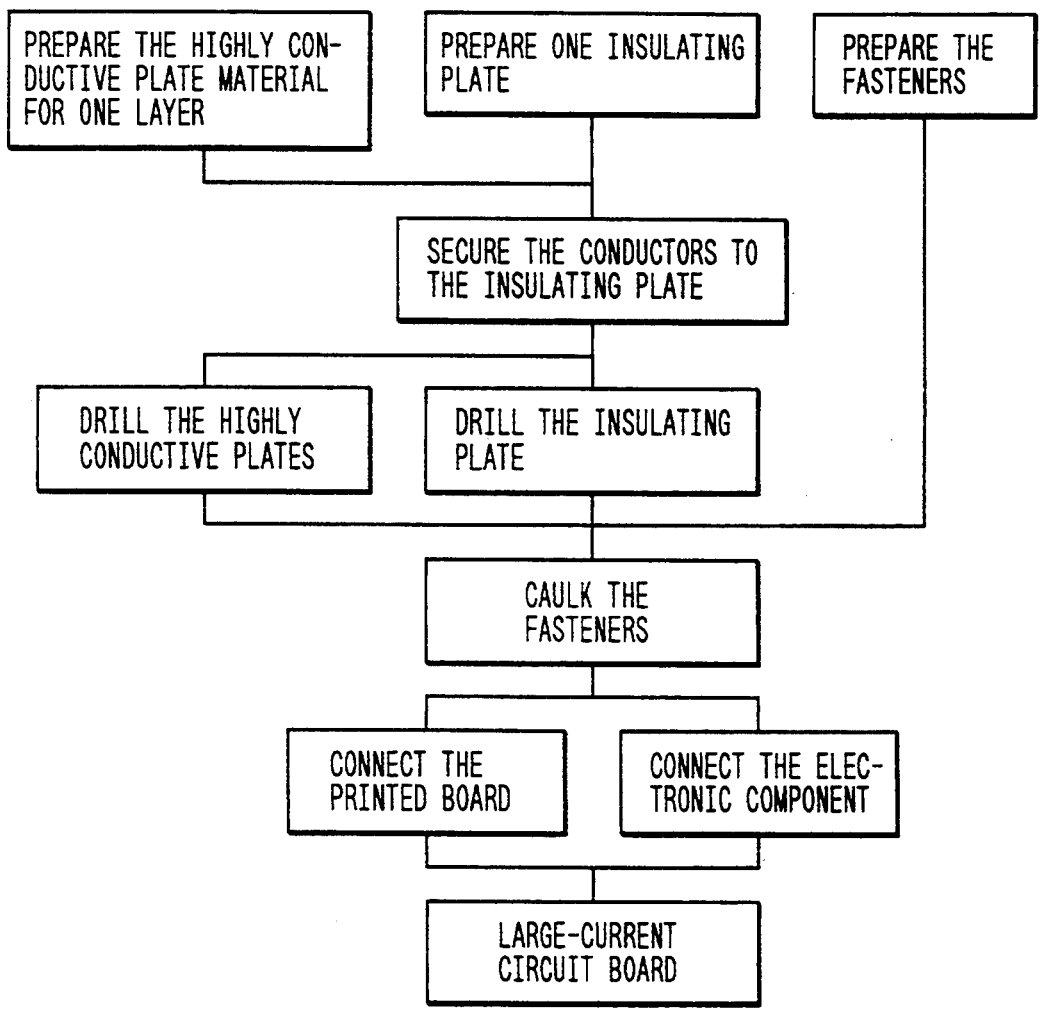
FIG. 17 is a manufacturing flowchart of the large-current board shown in FIG. 16.

An example of the manufacturing sequence of the apparatus in Embodiment 10 shown in FIG. 17 will now be described.

(1) First, prepare a highly conductive plate material, the insulating plate 2001 and the fasteners 1105 matching the current and connection arrangement.

(2) Next, cut the highly conductive plate material into wiring shapes and secure them onto the insulating plate 2001 as the busbars 1402. The busbars 1402 may be secured onto the insulating plate 2001 by adhesive, screwing or the like.

(3) Subsequently, form the fastener connecting holes 1402a in the portions of the busbars 1402 where the fasteners 1105 are caulked and secured.

(4) Then, form the interference prevention holes 2001a for the flange portions 2003 of the fasteners 1105 in the insulating plate 2001 in the portions of the busbars 1402 where the fasteners 1105 are caulked and secured.

(5) Subsequently, caulk and secure the fasteners 1105 to the busbars 1402.

(6) Finally, constitute the electrical connections of the busbars 1402 and the fasteners 1105, of the printed wiring board 1201 and the fasteners 1105, and of the electronic component 1403 and the fasteners 1105 in the predetermined connection portions to form the circuit board.

Figure 18:
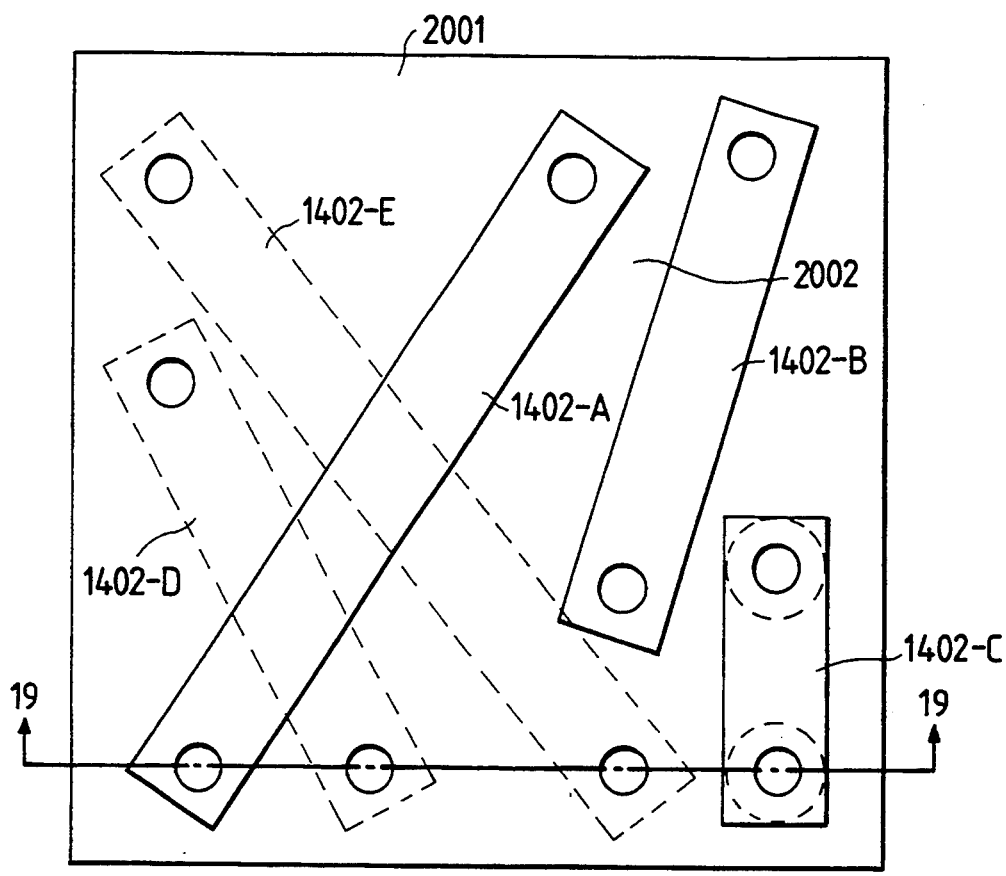
FIG. 18 is a diagrammatic plan arrangement diagram of a large-current circuit board according to an embodiment of the invention.
Figure 19:
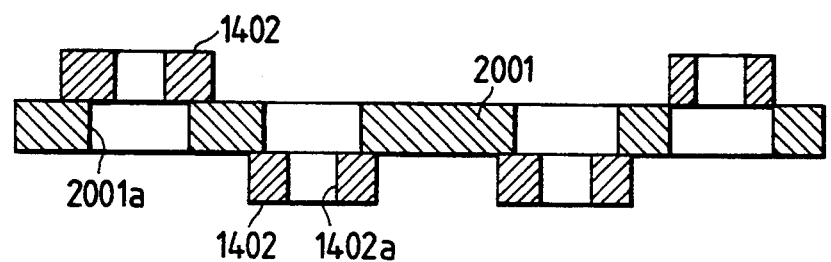
FIG. 19 is a sectional side view taken along the plane 19—19 of FIG. 18.
Figure 20:
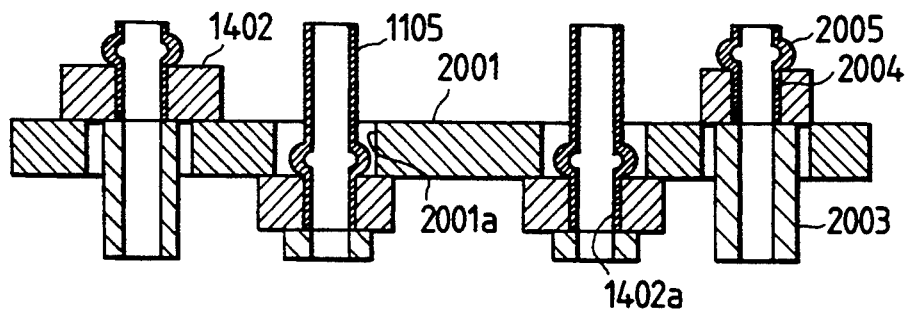
FIG. 20 is a diagrammatic sectional arrangement diagram of the large-current circuit board in FIG. 19 fitted with fasteners.
Figure 21:
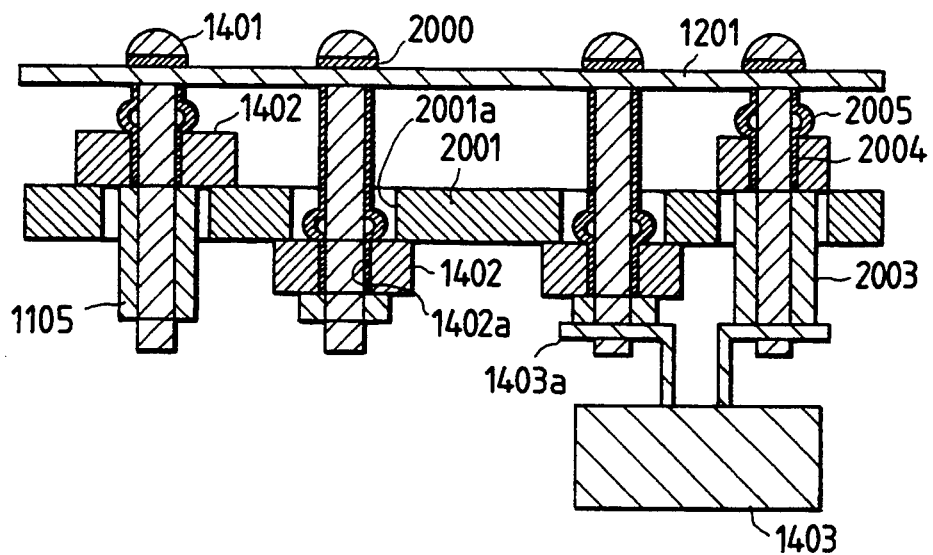
FIG. 21 is a diagrammatic sectional arrangement diagram of the large-current circuit board in FIG. 19 connected with a printed wiring board and an electronic component.

An eleventh embodiment of the invention will now be described in accordance with FIGS. 18 to 21. FIG. 18 is a diagrammatic plan arrangement diagram of a circuit board, FIG. 19 is a sectional side view taken along the line 19—19 of FIG. 18, FIG. 20 is a diagrammatic sectional arrangement diagram of the circuit board fitted with the fasteners 1105, and FIG. 21 is a diagrammatic sectional arrangement diagram of the circuit board connected with the printed wiring board 1201 and the electronic component 1403. Referring to these drawings, 1402-A, 1402-B and 1402-C denote busbars secured to the top surface of the insulating plate 2001, and 1402-D and 1402-E indicate busbars secured to the bottom surface of the insulating plate 2001. The other parts are identical to those described in Embodiment and will not described here.

The plurality of busbars 1402 are disposed and secured to both the top and bottom surfaces of the insulating plate 2001 at the insulation distance 2002 from each other as in the apparatus according to the present embodiment to allow the circuit to be wired with high density.

A twelfth embodiment of the invention will now be described in accordance with FIGS. 22 to 25. FIG. 22 is a diagrammatic plan arrangement diagram of a circuit board, FIG. 23 is a sectional side view taken along the line 23—23 of FIG. 22, FIG. 24 is a diagrammatic sectional arrangement diagram of the circuit board fitted with the fasteners 1105, and FIG. 25 is a diagrammatic sectional arrangement diagram of the circuit board connected with the printed wiring board 1201 and the electronic component 1403. In these drawings, 1402-A and 1402-B designate busbars secured to the top surface of the insulating plate 2001, 1402-C, 1402-D and 1402-E represent busbars secured to the bottom surface of the insulating plate 2001, and 2006 denotes interference prevention holes for the fasteners 1105 provided in the busbars 1402. The other parts are identical to those described in Embodiment 11 and therefore will not described.

When the fasteners 1105 connected to the busbar 1402-A and to the busbars 1402-D and 1402-E are fitted in the apparatus according to the present embodiment, the interference prevention holes 2006 for the fasteners 1105 provided in the busbar 1402-A allow the busbar 1402-A to be isolated from the fasteners 1105 connected to the busbars 1402-D and 1402-E when such isolation is required.

An example of the manufacturing sequence of the apparatus in Embodiment 12 shown in FIG. 26 will now be described.

(1) First, prepare a highly conductive plate material for two layers, the insulating plate 2001 and the fasteners 1105 matching the current and connection arrangement.

(2) Next, cut the highly conductive plate material into wiring shapes and secure them onto the insulating plate 2001 as the busbars 1402. The busbars 1402 may be secured onto the insulating plate 2001 by adhesive, screwing or the like.

(3) Subsequently, form the fastener connecting holes 1402a in the portions of the busbars 1402 where the fasteners 1105 are caulked and secured.

(4) Further, form the interference prevention holes for the flange portions 2003 of the fasteners 1105 in the insulating plate 2001 in the portions of the busbars 1402 where the fasteners 1105 are caulked and secured.

(5) When the fasteners 1105 in the portions of the busbars 1402 where the fasteners 1105 are caulked and secured must be isolated from the other busbar 1402, form the isolating holes 2006 between the fasteners 1105 and the busbar 1402 to be isolated.

(6) Subsequently, caulk and secure the fasteners 1105 to the busbars 1402.

(7) Finally, constitute the electrical connections of the busbars 1402 and the fasteners 1105, of the printed wiring board 1201 and the fasteners 1105, and of the electronic component 1403 and the fasteners 1105 in the predetermined connection portions to form the circuit board.

A thirteenth embodiment of the invention will now be described in accordance with FIGS. 27 to 29. FIG. 27 is a diagrammatic view of a circuit board wherein two sets of structures arranged by securing the busbars 1402 on both the top and bottom surfaces of the insulating plate 2001 described in Embodiment 11 are secured in a layer design of structure-insulating plate-structure, FIG. 28 is a diagrammatic sectional view of the circuit board shown in FIG. 27 where the fasteners have been caulked and secured, and FIG. 29 is a diagrammatic sectional arrangement diagram of the circuit board connected with the printed wiring board 1201 and the electronic component 1403. In these drawings, 2007 indicates an insulating plate added to constitute the multiple layers and the other parts are identical to those described in each of the embodiments and will not described here.

An example of the manufacturing sequence of the apparatus in Embodiment 13 shown in FIG. 30 will now be described.

(1) First, prepare a highly conductive plate material for four layers, three insulating plates 2001 and the fasteners 1105 matching the current and connection arrangement.

(2) Next, cut the highly conductive plate material into wiring shapes to use them as the busbars 1402, and fabricate two structures on each of which the busbars 1402 are secured on the top and bottom surfaces of the single insulating plate 2001. The busbars 1402 may be secured onto the insulating plate 2001 by adhesive, screwing or the like.

(3) Subsequently, secure the structures in the layer design of structure-insulating plate 2007-structure.

(4) Form the fastener connecting holes 1402a in the portions of the busbars 1402 where the fasteners 1105 are caulked and secured.

(5) Further, form the interference prevention holes 2001a for the flange portions 2003 of the fasteners 1105 in the insulating plate 2001 in the portions of the busbars 1402 where the fasteners 1105 are caulked and secured.

(6) Further, when the fasteners 1105 in the portions of the busbars 1402 where the fasteners 1105 are caulked and secured must be isolated from the other busbar 1402, form the isolating holes 2006 between the fasteners 1105 and the busbar 1402 to be isolated.

(7) Subsequently, caulk and secure the fasteners 1105 to the busbars 1402.

(8) Finally, constitute the electrical connections of the busbars 1402 and the fasteners 1105, of the printed wiring board 1201 and the fasteners 1105, and of the electronic component 1403 and the fasteners 1105 in the predetermined connection portions to form the multi-layer circuit board.

A fourteenth embodiment of the invention will now be described in accordance with FIGS. 31 and 32. In this embodiment, a laminated structure of a conductor 2007 and the insulating plate 2001 is employed to manufacture the structure of the circuit board. FIG. 31 is a diagrammatic view of a laminated structure of the single-layer conductor 2007 and the single-layer insulating plate 2001, and FIG. 32 is a diagrammatic view of an example wherein the conductor 2007 part of the laminated structure of the single-layer conductor 2007 and the single-layer insulating plate 2001 has been divided into sections to form the busbars 1402 from the laminated conductor 2007. It is to be understood that two layers of the conductors may be laminated on both the top and bottom surfaces of the single-layer insulating plate similarly as in FIG. 31. The structure of the busbars 1402 and the insulating plate 2001 as in FIG. 32 was used as the structure equivalent to the one shown in said FIG. 13 to form the circuit board in a similar manner as described above. 2008 indicates an insulating resin filled in a groove 2009 between the busbars 1402.

Similarly, a laminated structure having two layers of the conductors on both the top and bottom surfaces of one layer of the insulating material may also be employed, and the structure may replace the structure in FIG. 18 or FIG. 22 previously described in order to constitute the circuit board.

Also, the layer-built structures may be laminated to manufacture a similar multi-layer circuit board, and an example of the manufacturing sequence of the apparatus in Embodiment 14 shown in FIG. 33 will now be described.

(1) First, separately prepare in two sets a highly conductive plate material for two layers, one insulating plate and two film adhesives, then proceed with a lamination adhesion process in which the adhesives are set. Specifically, use, for example, two 100 mm × 100 mm × 2 mm copper plates as the conductors 2007 made of a highly conductive material, employ a glass epoxy plate of 100 mm × 100 mm × 1.6 mm as the insulating plate 2001, apply film adhesives 100 × 100 (e.g., Three Bond 1650 film adhesives) thereto, and laminate-bond them at 160° C. for 30 seconds with the application pressure of 4 kg/cm².

(2) Next, in two sets, divide the highly conductive plate material into sections by milling the conductor 2007 parts to form the groove 2009 that divides the conductors 2007.

(3) Subsequently, both the conductors 2007 and the insulating plate 2001 in the predetermined positions in the predetermined dimensions. It is to be understood that the conductors 2007 are drilled with holes of 11.2 mm diameter and the insulating plate 2001 is drilled with holes of 15 mm diameter.

(4) Then, caulk and secure the fasteners 1105 of which outside diameter is 11 mm, flange diameter is 14 mm, and caulked portion outside diameter is 14 mm.

(5) Subsequently, constitute the electrical connections of the busbars 1402 and the fasteners 1105, of the printed wiring board 1201 and the fasteners 1105, and of the electronic component 1403 and the fasteners 1105 in the predetermined connection portions to form the multi-layer circuit board.

The formation of the groove 2009 on the insulating plate 2001 as described above increases a creeping distance to improve insulation reliability, and the filling of the insulation resin 2008 in said groove 2009 further improves insulation reliability. FIG. 33 shows a flow-chart for manufacturing the circuit board in Embodiment 14.

In each of the foregoing embodiments, the embodiments are not limited to the copper material given as the highly conductive material by way of example, and any material that has high conductivity, high mechanical strength and comparatively high ductility, such as a copper-based alloy material, aluminum, an aluminum-based alloy material or an iron-based material, may be employed to provide the same effects.

Also, in each of the embodiments, the present invention is not limited to the glass epoxy material provided as the insulating material by way of example, and another thermoset board material, a heat-resistant thermoplastic material, or a composite material of these may be used to produce the identical effects.

Further, in each of the embodiments, the present invention is not limited to the film adhesives given as the adhesive material by way of example, and a preimpregnated material, such as an epoxy-based preimpregnated material and a bismaleimide-based preimpregnated material, or any of various adhesives, e.g., silicone-based adhesive, epoxy-based adhesive, polyamide-based adhesive, phonol-based adhesive, polyimide-based adhesive, acrylic adhesive and hot-melt adhesive, is applicable to have the same effects.

It should be understood that while the multi-layer circuit boards of up to four layers were described in the preferred embodiments as examples, the present invention is not always limited to four layers and the increase of the first, the second and the third structures in the same manner permits the manufacturing of a further multi-layered circuit board.

It will be apparent that the invention, as described above, achieves a large-current circuit board wherein a plurality of fasteners are different in height from a secured portion on a circuit board to a connection portion with a bus bar, whereby a plurality of busbars having a strip-like planar plate shape for connecting said plurality of fasteners do not cross each other and wirings can be run in multi-layers and increased in density.

It will also be apparent that the invention achieves a large-current circuit board wherein at least any of a plurality of busbars are disposed on one side of a busbar securing board facing a circuit board, that the third embodiment will achieve a large-current circuit board wherein at least any of a plurality of busbars are disposed on one side of a busbar securing board opposite to a circuit board, that through holes passing through said busbars and said busbar securing board are formed in the locations of both ends of each of said busbars, and that said fasteners and said busbars are integrally screwed together with said busbar securing board, whereby busbar wiring work using said busbar securing board is facilitated and contact reliability is enhanced.

It will also be apparent that the invention achieves a large-current circuit board wherein elastic materials are disposed between a busbar securing board and a plurality of busbars, whereby said elastic materials serve as spring washers to reliably screw a plurality of fasteners and said plurality of busbars.

It will also be apparent that the invention achieves a large-current circuit board wherein fasteners are caulked and secured to busbars themselves and a circuit board is fitted to said fasteners by screw members via elastic members, whereby a large-current circuit board having high reliability can be provided.

It will also be apparent that the invention achieves a large-current circuit board wherein the diameters of fastener passing holes formed in busbars are designed to be larger than the diameters of fastener passing holes formed in an insulating material, whereby the fasteners can be caulked and secured to the busbars without the interference of the insulating material with the caulking-deformed portions of the fasteners.

It will also be apparent that the invention achieves a large-current circuit board which consists of a plate-shaped insulating material and a plurality of busbars fitted integrally on said insulating material via a groove of a predetermined gap therebetween. The invention also achieves a large-current circuit board wherein an insulating resin is filled in the groove of the predetermined gap, whereby the large-current circuit board of high insulation reliability is provided.

What is claimed is:

1. A large-current board assembly comprising:
a circuit board defining a substantially planar surface;

a first plurality of fasteners positioned apart and secured to said circuit board, each said fastener extending an axial length from said planar surface and having at least a first supporting means disposed along said axial length;

a first plurality of busbars for electrically connecting at least a first group of said first plurality of fasteners, each busbar in said first plurality of busbars having a planar plate shape and being supported by said first supporting means;

a second plurality of fasteners positioned apart and secured to said circuit board, each said fastener extending an axial length from said planar surface and having at least a second supporting means disposed along said axial length;

a second plurality of busbars for electrically connecting at least a group of said second plurality of fasteners, each busbar in said second plurality of busbars having a planar plate shape and being supported by said second supporting means; and wherein a first group of fasteners in said first plurality of fasteners has said first supporting means disposed along said axial length at a substantially similar first position and a first group of fasteners in said second plurality of fasteners has said second supporting means disposed along said axial length at a substantially similar second position, so that said first plurality of busbars connected to said first group of fasteners are disposed at a level with respect to said circuit board that is different from a level of said second plurality of busbars resulting in said first plurality of busbars being electrically insulated from said second plurality busbars.

2. A large-current circuit board assembly as set forth in claim 1 wherein:
at least one of said first and second plurality of fasteners is compressively secured and calked directly to said busbars.

3. A large-current circuit board assembly as set forth in claim 1 wherein each fastener in said plurality of fasteners further comprises:
a flange portion for engaging a surface of said circuit board, a compressible portion for engagingly collapsing upon application of an axial compressive force, and an axial screw passage for receiving a screw which applies an axial force to said collapsible portion.

4. A large-current circuit board assembly as set forth in claim 1 further comprising:
at least a first pair of said fasteners extending in a first direction from said circuit board and at least a second pair of fasteners extending in a second direction opposite to said first direction; and
wherein at least a first busbar is connected to said first pair of fasteners and at least a second busbar is connected to said second pair of fasteners.

5. A large-current circuit board assembly as set forth in claim 1 wherein:
said circuit board comprises through holes sized for passing said fasteners therethrough and said fasteners comprise means for securing said fasteners to said circuit board.

6. A large-current circuit board assembly as set forth in claim 4 wherein:
said circuit board comprises through holes for passing said fasteners therethrough for disposition of corresponding ones of said first and second pairs of fasteners on opposite sides of said circuit board.

7. A large-current circuit board assembly as set forth in claim 1 further comprising:
a busbar securing board for electrically connectibly holding and securing at least one of said first and second plurality of busbars, said board being secured to at least one of said first and second groups of fasteners.

8. A large-current circuit board assembly as set forth in claim 7 further comprising:
a screw passing axially through said at least one of said fasteners and engaging a threaded means for securing said busbar securing board and said circuit board to said fastener.

9. A large-current circuit board assembly as set forth in claim 7 wherein:
said busbar securing board comprises through holes for passing said fasteners therethrough for disposition of portions of said fasteners on opposite sides of said busbar securing board.

10. A large-current circuit board assembly as set forth in claim 7 wherein at least one of said first and second plurality of busbars is disposed on one side of said busbar securing board opposite to said circuit board, said busbars and said busbar securing board having through holes formed therein so that said at least one fastener and said bus bars are held and supported at said supporting means.

11. A large-current circuit board assembly as set forth in claim 9 wherein said through holes for said busbar securing board have a diameter larger than the outside diameter of said fasteners, and said second group of fasteners comprises securing means for securing said busbar securing board integrally with said circuit board and said plurality of busbars.

12. The large-current circuit board as defined in claim 11 further comprising a plurality of busbar securing boards and wherein at least a first one of said busbar securing boards is disposed farther than a second one of said busbar securing boards from said circuit board among said plurality of busbar securing boards, at least said second busbar securing board comprises said through holes.

13. The large-current circuit board as defined in claim 7 wherein at said busbar securing board has busbars mounted on opposite surfaces thereof.

14. The large-current circuit board assembly as defined in claim 7 further comprising elastic means disposed between the busbar securing board surface and at lest a plurality of busbars to secure said plurality of fasteners and said plurality of busbars.

15. A large-current circuit board assembly comprising:
a plurality of busbars made of a conductive material and formed in a planar shape, said busbars having holes formed at predetermined positions;
a plurality of fasteners having first and second end portions and extending axially therebetween, said fasteners being secured in said holes; and
a circuit board having a planar surface and being fitted to said fasteners proximate said first end portion or between said first and second end portions; and
wherein said fastener axial dimension extends orthogonally to said planar surface and said plurality of busbars are connected to respective ones of said fasteners at predetermined positions along said fasteners so that said plurality of busbars are electrically insulated from each other.

16. The large-current circuit board assembly as defined in claim 15 further comprising elastic means and screw members for securing said circuit board to said fasteners.

17. A large-current circuit board assembly comprising:
   busbar means being made of a conductive material that is formed in a planar shape for conducting large current and having holes formed at predetermined positions of said busbar means;
   fastening means having first and second end portions and being caulked and secured in said holes of at least one of said predetermined busbar means;
   a circuit board fitted to one of said first and second end portion of said fasteners; and
   an insulating support plate having first and second planar surfaces, said second planar surface being disposed between said busbar means and said circuit board, and having said busbar means formed on one of said first or second surfaces, said plate having holes therein for passing a corresponding one of said fasteners therethrough; and
   the diameters of said holes formed in said insulating plate being larger than the diameters of said holes formed in said busbars.

18. A large-current circuit board assembly as set forth in claim 17 further comprising:
   screw members for securing said fasteners, circuit board and buses into an assembly, and elastic members for compressibly securing said busbars to said fasteners.

19. The large-current circuit board assembly as defined in claim 17 wherein said plate-shaped insulating material and said plurality of busbar means are fitted integrally on said insulating material with a groove therebetween having a predetermined gap filled with insulating resin.

20. A large current circuit board assembly made by the process of:
   preparing a circuit board with a plurality of through holes therein;
   preparing a plurality of fasteners, said fasteners comprising at least plural pairs of fasteners having different axial lengths and a cross section sized to fit through corresponding ones of said through holes, a circuit board engagement portion at one end and a support means at an opposite end;
   preparing a plurality of busbars having a strip-like planar shape with through holes therein at predetermined locations at distal ends thereof;
   positioning said pairs of fasteners beforehand on said circuit board by said board engagement portion and at predetermined locations; and
   electrically connecting said busbars to said corresponding pairs of fasteners, whereby said busbars are disposed in plural layers above said circuit board so that said busbars are electrically insulated from each other.

21. The circuit board assembly as set forth in claim 20 wherein said fasteners, said busbars and said circuit board are assembled by screwing a screw axially through said busbar holes, said circuit board holes and said fastener holes.

22. The circuit board assembly as set forth in claim 20 further comprising the steps of:
   preparing a bus supporting board by assembling said planar buses to an insulating board;
   preparing through holes in said supporting board coaxial with said bus bar holes; and
   assembling said supporting board to said fasteners by passing at least one of said fasteners or said screw through said through holes for securing of such components.

23. The circuit board assembly as set forth in claim 22 wherein said support board preparing step comprises:
   fitting said busbar material and insulating material integrally to form a laminate structure;
   removing said busbar material thereby defining desired busbar shapes with a gap therebetween; and
   preparing through holes in said busbar and insulating material, the diameters of said holes formed in said insulating material being larger than the diameters of said holes formed in said busbars.

24. The circuit board assembly as set forth in claim 23 wherein said defining step comprises filling an insulating resin in said gap between said busbars.

25. The circuit board assembly as set forth in claim 20 wherein said fasteners are calked and secured in holes formed in said busbars.

* * * * *